United States Patent [19]

Horne et al.

[11] Patent Number: 5,812,832

[45] Date of Patent: Sep. 22, 1998

[54] DIGITAL CLOCK WAVEFORM GENERATOR AND METHOD FOR GENERATING A CLOCK SIGNAL

[75] Inventors: Stephen C. Horne; Scott H. R. McMahon, both of Austin, Tex.

[73] Assignee: Advanced Micro Devices, Inc., Sunnyvale, Calif.

[21] Appl. No.: 11,068

[22] Filed: Jan. 29, 1993

[51] Int. Cl.[6] .................................. G06F 1/04; G06F 1/08
[52] U.S. Cl. ........................ 395/556; 364/270; 364/934.2; 364/934.3
[58] Field of Search ...................... 395/650, 700, 395/555, 556; 364/270, 270.1, 934, 934.2, 934.3

[56] References Cited

U.S. PATENT DOCUMENTS

| | | | |
|---|---|---|---|
| 3,725,793 | 4/1973 | Phillips | 328/63 |
| 4,063,308 | 12/1977 | Collins et al. | 364/200 |
| 4,412,342 | 10/1983 | Khan et al. | 375/107 |
| 4,419,739 | 12/1983 | Blum | 364/900 |
| 4,435,757 | 3/1984 | Pross, Jr. | 364/200 |
| 4,543,657 | 9/1985 | Wilkinson | 375/1 |
| 4,598,257 | 7/1986 | Sothard | 331/2 |
| 4,692,932 | 9/1987 | Denhez et al. | 375/107 |
| 4,977,581 | 12/1990 | Cerminara | 375/107 |
| 4,989,175 | 1/1991 | Boris et al. | 364/900 |
| 5,059,818 | 10/1991 | Witt et al. | 370/269 |
| 5,077,686 | 12/1991 | Rubinstein | 395/550 |
| 5,079,440 | 1/1992 | Roberts et al. | 327/155 |
| 5,224,129 | 6/1993 | Lueker et al. | 375/118 |
| 5,256,994 | 10/1993 | Langendorf | 331/16 |
| 5,307,381 | 4/1994 | Ohuja | 375/107 |

FOREIGN PATENT DOCUMENTS 0 155 041 A2  2/1985  European Pat. Off. .

*Primary Examiner*—Emanuel T. Voeltz
*Assistant Examiner*—Michael T. Richey
*Attorney, Agent, or Firm*—Conley, Rose & Tayon; B. Noel Kivlin

[57] ABSTRACT

A digital clock waveform generator and method for generating a clock signal are provided for a microprocessor or other digital circuit to provide on chip generation of internal clock signals having the same frequency as or a higher or lower frequency than an externally applied clock signal. In one embodiment, the waveform generator includes a delay chain and a control unit that matches the propagation delay of the delay chain to the period of an input timing signal. The waveform generator provides precise control of the duty cycles of the internally generated clock signals, and allows for rapid starting and stopping of the internal clock signals for power reduction functions. The waveform generator may further provide a system clock, and may include circuitry to precisely control the phase relationships between the various clock signals. The waveform generator is easily manufactured with digital circuitry that automatically compensates for changing environmental conditions such as operating voltage and temperature.

20 Claims, 27 Drawing Sheets

DIGITAL CLOCK WAVEFORM GENERATOR AND METHOD FOR GENERATING A CLOCK SIGNAL

BACKGROUND OF THE INVENTION

1. Field of the Invention

This invention relates to clock generation circuitry and, more particularly, to clock generators that provide clock signals with controlled duty cycles. The invention also relates to methods for generating clock signals.

2. Description of the Relevant Art

It is well known that microprocessor circuits require clock signals to provide frequency and timing references for controlling internal activities. A microprocessor typically receives an external clock signal generated by a crystal oscillator or other external clock source and, using this external clock signal, generates an internal clock signal having a high degree of stability. The internally generated clock signal may have the same frequency as that of the external clock signal or may have a frequency that is a fraction or a multiple of the external clock signal frequency. The microprocessor may also generate a system clock having a fifty percent duty cycle to provide a timing reference for off chip circuitry.

A microprocessor generally must be clocked by an internal clock signal having a first phase and a second phase for each clock cycle period. The clock signal first phase is at a high level for a first execution time period and the second phase is at a low level for a second execution time period to complete each clock cycle. The reason for this clocking procedure is that most microprocessors include a first portion of circuitry that is active during the high level first phase of the clock signal and another portion of circuitry that is active during the low level second phase of the clock signal. For this reason, the microprocessor typically generates a pair of internal clock signals that are 180 degrees out of phase, one being provided to the first portion of the circuitry and the second being provided to the other portion of the circuitry.

It is often desirable to operate a microprocessor at higher speeds by increasing the clock frequency. However, the first and second phases of each clock signal cycle must be of sufficient duration to enable both portions of the microprocessor circuitry to complete their execution. Each such portion requires some finite minimum execution time because of internal microprocessor delays resulting from internal speed paths. These speed paths exist in general between one clock edge and another clock edge, and the speed paths for each circuit portion need not be, and generally are not, uniform. To increase the maximum operational speed of the microprocessor, it is important to generate the clock signals with duty cycles that do not constrain more than necessary the time allotted for the speed paths of either portion of circuitry. For example, a 30% duty cycle clock signal may constrain the time allotted for the speed paths of the first circuit portion while allotting excessive time to the speed paths of the other circuit portion. Therefore, to ensure that the minimum execution times are met for both portions of the microprocessor circuitry while maximizing the allowable speed of operation, the duty cycles of the internal clock signals are typically regulated and maintained at fifty percent.

In addition to the foregoing, the internal speed paths and resulting first and second minimum execution time periods are greatly affected by integrated circuit processing parameters, microprocessor operating temperature, and microprocessor operating supply voltage. For example, a microprocessor's circuits execute more slowly as operating temperature increases. The circuits of a microprocessor also operate more slowly as the operating supply voltage decreases. In either or both of these cases, the duration of the first and second clock signal phases must be extended to provide first and second execution times which are sufficient to accommodate the increased first and second minimum execution time periods.

Clock generators for providing such clock signals are generally provided "on chip" in microprocessor devices. However, as stated previously, they develop the clock signal or signals in response to an input clock signal generated by an external clock source. The on chip clock generator must be arranged to provide the clock signal first and second phases because external clock sources cannot always be relied upon to provide the clock signals accurately. In fact, external clock sources usually provide input clock signals having a duty cycle in a wide range. It is therefore required that the on chip clock generator be able to derive the clock signals for clocking the microprocessor responsive to an input clock signal having a wide range of duty cycles.

For convenience in generating an internal clock signal with a well-controlled duty cycle on-chip, the externally applied clock signal is often divided down in frequency by way of a frequency division circuit to generate the internal clock signal. This approach has been successful historically because although the external clock signal may vary in duty cycle, its frequency is very stable. Since the duty cycle of the divided-down internal clock is determined by the period of the external clock signal and not the duty cycle, the internal clock signal is provided with a stable duty cycle.

It may also be desirable to provide a system clock at an even lower frequency than the internal processor clock. This is often the case since off-chip logic such as external memory often cannot be scaled up in frequency as processor frequencies increase without becoming prohibitively expensive. Therefore, a second frequency division circuit may be provided to divide the frequency of the internal processor clock signal even further to provide the system clock.

As internal processor frequencies increase, however, the generation of an input clock that is twice the frequency of the internal processor clock becomes more expensive and difficult. Generating a high-frequency external clock signal can be more expensive because of the higher cost of the components needed and also because of the difficulties inherent to designing high frequency circuits. Also, generating a high-frequency external clock increases the amount of electromagnetic interference (EMI) generated.

Circuits have therefore been developed that directly generate (at 1× the frequency) the internal processor clock from an external clock signal and that further divide down with simple logic the internal clock to generate a lower frequency system clock. Although such circuits can reduce the expense and difficulty of design compared with using an input clock that is 2× relative to the internal processor clock, it is more difficult to control the duty cycle of the internal clock. Thus, either an input clock with a very precise duty cycle must be provided or some loss of performance will result. Since it is difficult and expensive to control the input clock duty cycle precisely, performance loss is typical.

Another approach is to generate an internal processor clock that is a multiple of the input clock frequency. Phase locked loops (PLLs) are used in some systems to generate these higher frequency internal clocks. Phase locked loops, while being generally successful in this regard, do suffer from a number of disadvantages. Such circuits are difficult to integrate into digital microprocessors because they are susceptible to the noise generated by the microprocessor's digital circuitry. Phase locked loops are analog in nature and require stable voltage or current references. Such references are difficult to build in high-volume semiconductor processes optimized for digital logic. Phase locked loops also do not provide good control of the resulting clock's duty cycle, and may not accommodate as wide a range of external clock duty cycles and frequencies which might be desirable. Another drawback to PLLs is that it is difficult to stop and restart the clocks in a rapid manner. For low-power applications, it is desirable to be able to stop the clocks (and therefore all activity) in the microprocessor to reduce current draw of the processor to the microamp level.

Another desirable feature of microprocessor clocks is the precise control of the phase relationship between the system clock and the (higher frequency) internal processor clocks. This is because the relationship between external signals (either inputs to or outputs from the processor) and the internal processor clocks can create speed paths (either in the processor or outside the processor). The situation is aggravated when multiple processor chips must run synchronously. Problems associated as a result of such speed paths can be minimized by precisely controlling the phase relationships between the system clocks and the internal clocks.

SUMMARY OF THE INVENTION

A digital clock waveform generator and method for generating a clock signal are therefore provided for a microprocessor or other digital circuit to provide on chip generation of internal clock signals having the same frequency as or a higher or lower frequency than an externally applied clock signal. The waveform generator provides precise control of the duty cycles of the internally generated clock signals, and allows for rapid starting and stopping of the internal clock signals for power reduction functions. The waveform generator may further provide a system clock, and may include circuitry to precisely control the phase relationships between the various clock signals. The waveform generator is easily manufactured with digital circuitry that automatically compensates for changing environmental conditions such as operating voltage and temperature.

These and other advantages are achieved with the present invention, in accordance with which a digital clock waveform generator comprises a variable delay circuit including an input line, an output line, and a control line, wherein a propagation delay of a propagation path between the input line and the output line with respect to a timing signal is variably controllable in response to a control signal provided to the control line. A control means is coupled to the control line of the variable delay circuit for adjusting the propagation delay of the variable delay circuit such that the period of the timing signal substantially equals the propagation delay of the variable delay circuit. A signal synthesis circuit is coupled to a node along the propagation path of the variable delay circuit, wherein the clock synthesis circuit generates a clock signal having a duty cycle and a period that are dependent upon an occurrence of signal transitions at the node along the propagation path of the variable delay circuit.

In accordance with another aspect of the invention, a method for generating a clock signal comprises the steps of providing a timing signal to a variable delay circuit, controlling a propagation delay of a propagation path within the variable delay circuit such that a period of the timing signal substantially equals the propagation delay of the variable delay circuit, and generating a clock signal having a duty cycle and a period that are dependent upon signal transitions that occur at a node along the propagation path of the variable delay circuit.

The invention will be more readily understood with reference to the drawings and the detailed description. As will be appreciated by one skilled in the art, the invention is applicable to clock waveform generators in general and is not limited to the specific embodiments disclosed.

DETAILED DESCRIPTION

The following includes a detailed description of the best presently contemplated modes for carrying out the invention. The description is intended to be merely illustrative of the invention and should not be taken in a limiting sense.

Figure 1:
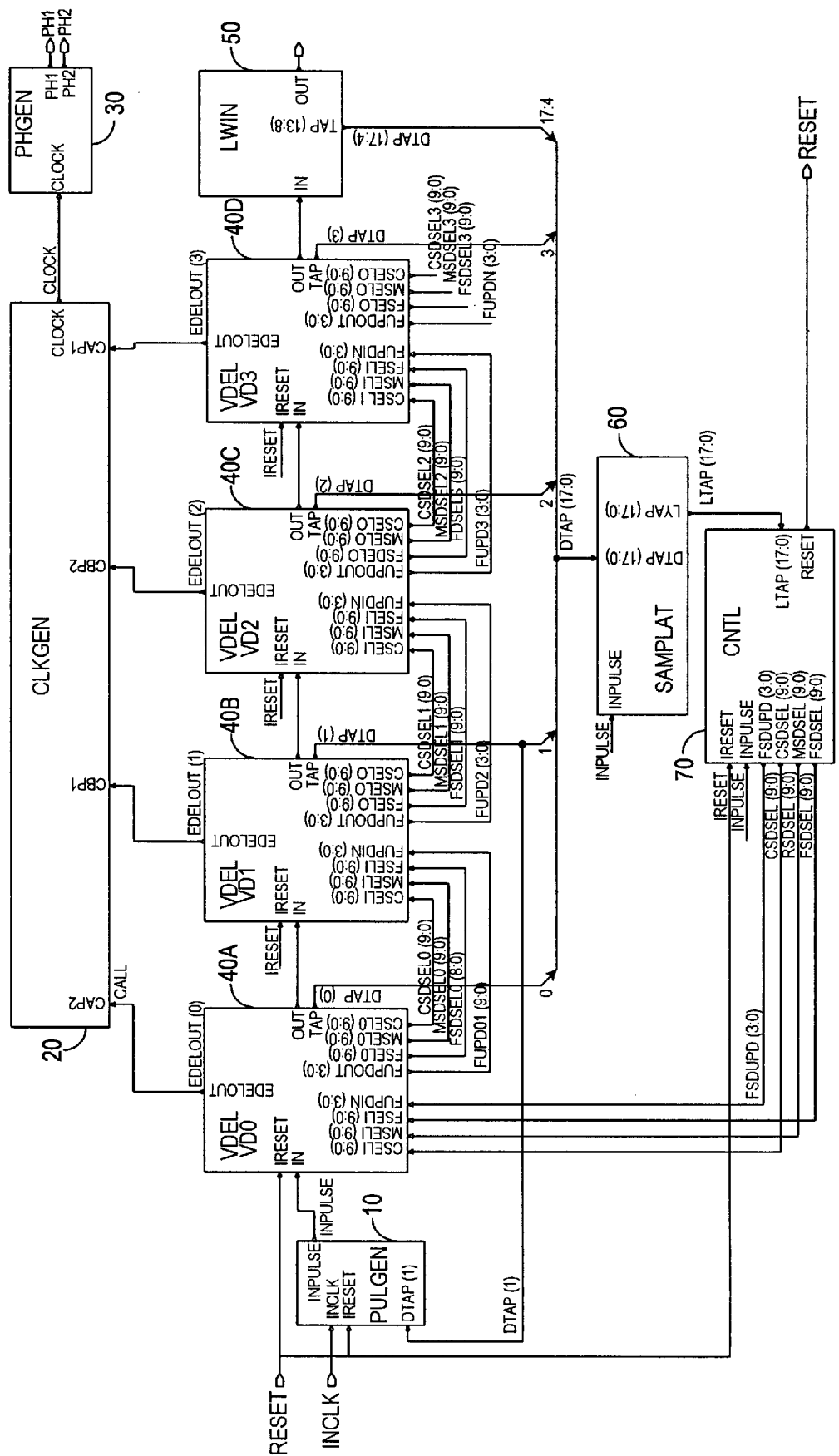
FIG. 1 is a block diagram of a clock signal waveform generator for generating internal microprocessor clock signals.

Referring first to FIG. 1, a block diagram is shown of a clock waveform generator circuit for generating internal microprocessor clock signals. The waveform generator includes a pulse generator unit 10 labeled PULGEN, a signal synthesis unit 20 labeled CLKGEN, and a phase generator unit 30 labeled PHGEN. The waveform generator further includes a delay chain section composed of a plurality of variable length delay units 40A–40D, each labeled VDEL. The waveform generator finally includes a lock window unit 50 labeled LWIN, a sampling latch unit 60 labeled SAMPLAT, and a control unit 70 labeled CNTL.

The clock waveform generator of FIG. 1 receives an externally generated clock signal labeled INCLK and generates a pair of internal clock signals labeled PH1 and PH2. Signal INCLK may be provided from, for example, an external crystal oscillator network. Signals PH1 and PH2 are non-overlapping clocks used to clock the microprocessor internally. In this embodiment, signals PH1 and PH2 may be either the same frequency or twice the frequency of signal INCLK, though any integer (or half integer) multiple of the frequency of signal INCLK is possible if a varied number of VDEL units 40A–40D are incorporated within the clock waveform generator.

Figure 2:
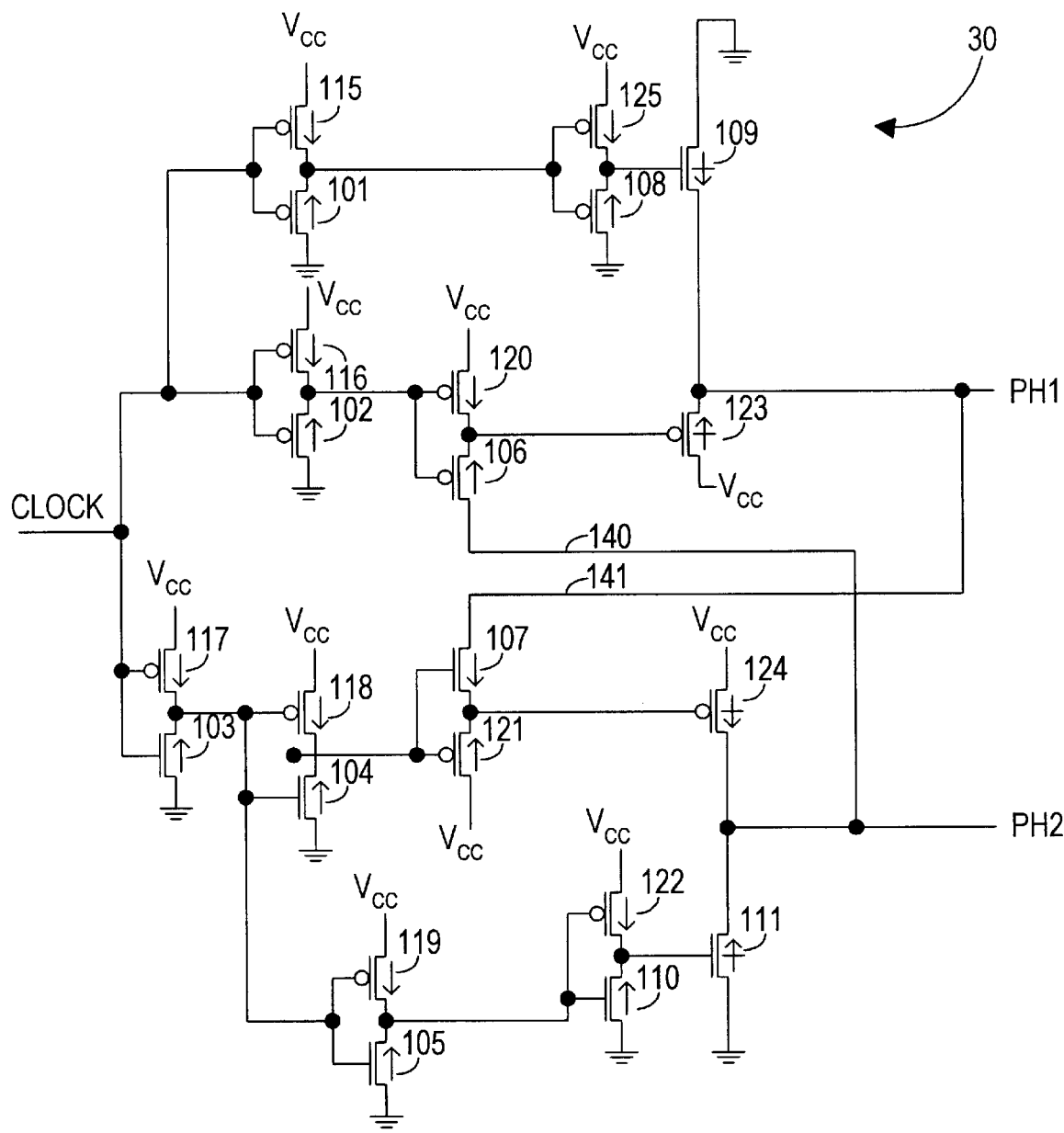
FIG. 2 is a schematic diagram of a phase generator unit that provides a pair of non-overlapping clock signals.

The phase generator unit 30 (PHGEN) shown in FIG. 1 is a clock buffer that receives an input clock signal (labeled CLOCK) and generates a 2-phase non-overlapping clock pair from it (signals PH1 and PH2). Referring to FIG. 2, a schematic diagram is shown of an exemplary PHGEN unit 30 that receives an input signal CLOCK and generates a two-phase non-overlapping clock pair from it. The phase generator unit 30 includes a plurality of N-channel field effect transistors 101–111 and a plurality of P-channel field effect transistors 115–125. It is evident that when signal CLOCK goes high, the output of an inverter formed by transistors 101 and 115 goes low, and the output of an inverter formed by transistors 108 and 125 goes high. Consequently, transistor 109 turns on and signal PH2 goes low. At the same time, the output of an inverter formed by transistors 103 and 117 goes low and the output of an inverter formed by transistors 104 and 118 goes high. The output of an inverter formed by transistors 107 and 121 consequently goes low and drives transistor 124 on. Therefore, signal PH1 goes high.

When signal CLOCK goes low, the output of an inverter formed by transistors 105 and 119 goes low and the output of an inverter formed by transistors 110 and 122 goes high. Consequently, signal PH1 goes low. At the same time, the output of an inverter formed by transistors 102 and 116 goes high, thereby causing an inverter formed by transistors 106 and 120 to go low. This therefore turns transistor 123 on, thus driving signal PH2 high.

It is noted that the phase generator circuit 30 as shown in FIG. 2 includes a pair of feedback lines 140 and 141 to ensure that signals PH1 and PH2 are 180 degrees out of phase with minimal overlap. The feedback line 141 prevents transistor 107 from turning on until signal PH2 reaches a threshold low voltage. This thereby prevents transistor 124 from turning on to drive signal PH1 high until after signal PH2 is falling low. Similarly, feedback line 140 prevents transistor 106 from turning on until signal PH1 has reached a low threshold voltage.

Referring back to FIG. 1, it would be possible to incorporate more than one PHGEN unit in the microprocessor, though only one is shown. Multiple PHGEN units coupled in parallel would distribute the drive of the microprocessor's internal clock signals PH1 and PH2 to reduce the load on each PHGEN unit.

Following an initialization sequence (to be described later), the clock waveform generator operates in the following manner. Signal INCLK, the externally generated clock signal provided to the processor, is provided to the PULGEN unit 10 that correspondingly generates a pulsing signal labeled INPULSE. Signal INPULSE can be thought of as a string of pulses, each with a rising edge and a falling edge, and having the same period as signal INCLK.

Each VDEL unit 40A–40D includes an input terminal labeled IN and an output terminal labeled OUT, and each is associated with a propagation delay referred to as a delay path length that is controllable by means of a series of control signals provided to each unit. The VDEL units are coupled in series with respect to one another such that each pulse of the signal INPULSE fed into the first VDEL unit 40A ultimately propagates in turn through each of the other three VDEL units 40B–40D. The overall delay path length through the four VDEL units 40A–40D is adjusted such that it matches the period of signal INCLK. Details of this adjustment operation will be described below. At this point, it is sufficient to say that the length of the delay chain is continuously adjusted to dynamically compensate for changing environmental parameters such as temperature and operating voltage. It is noted that the propagation time through the delay chain can vary either because the intrinsic delay is being changed by the control unit 70 through the addition or substraction of delay elements or because the changing environmental conditions are affecting the propagation time through each delay element. These environmental conditions are relatively slowly changing and can be compensated for by the delay chain control.

Four signals labeled EDELOUT(0), EDELOUT(1), EDELOUT(2) and EDELOUT(3) are provided from VDEL units 40A–40D, respectively, and each is derived from an identical node within the delay path of the respective VDEL unit 40A–40D. When the delay of the delay chain formed by VDEL units 40A–40D matches the period of signal INPULSE (and therefore the period of signal INCLK), then the previous rising edge of signal INPULSE is exiting the last VDEL unit 40D while the current rising edge of signal INPULSE is entering the first VDEL unit 40A. The four signals EDELOUT(3:0) leaving the VDEL units represent four equally spaced taps from the delay chain. They are equally spaced in the sense that signal EDELOUT(1) produces a rising edge one fourth of an INCLK period after signal EDELOUT(0) produces a rising edge. Similarly, signal EDELOUT(2) produces a rising edge one fourth of an INCLK period after signal EDELOUT(1) produces a rising edge, and signal EDELOUT(3) produces a rising edge one fourth of an INCLK period after signal EDELOUT(2) produces a rising edge. These four taps from the delay chain provide the timing references that are used by the clock synthesis circuit 20 (CLKGEN) to generate the 2× CLOCK signal (signal CLOCK is twice the frequency of signal INCLK). Specifically, in this embodiment, signals EDELOUT(1) and EDELOUT(3) cause signal CLOCK to go high and signals EDELOUT(0) and EDELOUT(2) cause signal CLOCK to go low.

Figure 3:
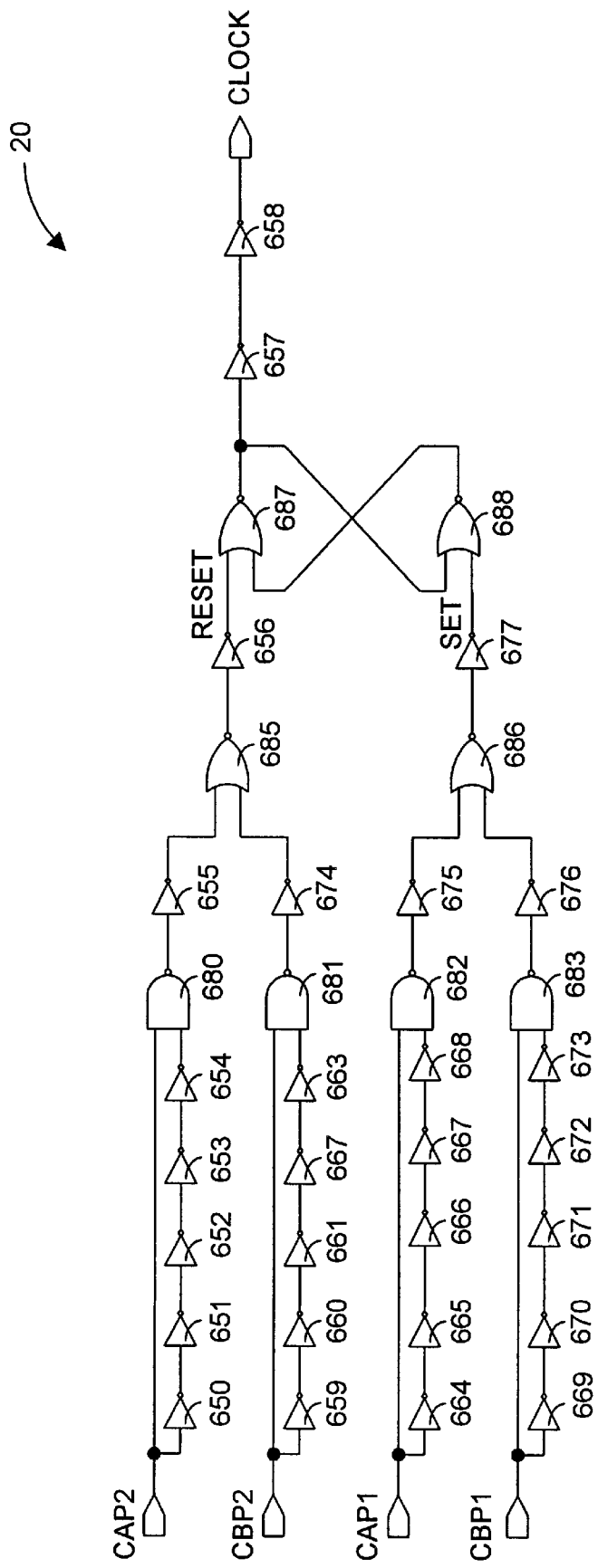
FIG. 3 is a schematic diagram of a clock synthesis unit.

Referring to FIG. 3, a schematic diagram is shown of the signal synthesis (CLKGEN) unit 20. The circuit includes a plurality of inverters 650–677, NAND gates 680–683, and NOR gates 685–688. It is evident that a latch is formed by NOR gates 687 and 688. The output lines of NAND gates 680–683 are normally high, and thus the output lines of NOR gates 685 and 686 are also normally high. When signal EDELOUT(0) goes high, it is received at an input labeled CAP2 and thereby causes the output of NAND gate 680 to pulse low. This consequently causes NOR gate 685 to go low, thereby resetting signal CLOCK in a low state. When signal EDELOUT(1) goes high, the output of NAND gate 83 pulses low momentarily, thereby driving the output of NOR gate 686 low. This sets the latch comprised of NOR gates 687 and 688, and thereby causes signal CLOCK to go high. Similar to the above described, signal EDELOUT(2) causes NAND gate 681 to pulse low, thereby causing the latch to reset and driving the signal CLOCK low. Signal EDELOUT (3) causes NAND gate 682 to pulse low, thereby setting the latch and driving the signal CLOCK high.

Referring back to FIG. 1, it is noted that in this embodiment, each of the VDEL units 40A–40D is characterized with an equal delay with respect to the others. Such characterization is not essential; if a duty cycle other than 50% is desired, the control of the VDEL units 40A–40D could be modified such that each VDEL unit is associated with a different delay. It is also noted that the CLKGEN unit 20 could produce waveforms with a duty cycle other than 50% by using the EDELOUT(3:0) timing reference signals differently. Such variations could be mask-programmable, software-programmable or under automatic hardware control depending on the application.

The VDEL units 40A–40D together with their associated control (the SAMPLAT block 60, LWIN block 50 and control block 70) can be considered in general terms as a means that matches the period of the synthesized clock signal to some fraction of the period of the incoming clock signal INCLK. These components also produce a precise control of the duty cycle on the signal CLOCK.

The operation of the delay chain assuming that the delay chain length has been matched to the period of signal INCLK is next considered. The algorithmic details of how the delay chain length is initialized and adjusted are discussed later.

As described above, a pulse is fed into the first VDEL unit 40A every cycle of signal INCLK. This pulse propagates through the four VDEL units 40A–40D. Following this, the pulse propagates from an input terminal of the lock window unit 50 labeled IN through to its output terminal labeled OUT. In addition to the EDELOUT timing reference signal tap leaving each VDEL unit is a tap point that is essentially representative of the output signal of each VDEL unit. The four taps provided from VDEL units 40A–40D are labeled DTAP(3:0) on FIG. 1. As used herein, the term "tap point" or "tap" refers to a circuit node along a propagation path within, for example, the delay chain or lock window units. There are fourteen additional taps provided from the LWIN block 50 labeled DTAP(4:17). The combination of these eighteen taps provide some visibility into various portions of the delay chain and greater visibility into the lock window. This will be better understood from the following.

Figure 4:
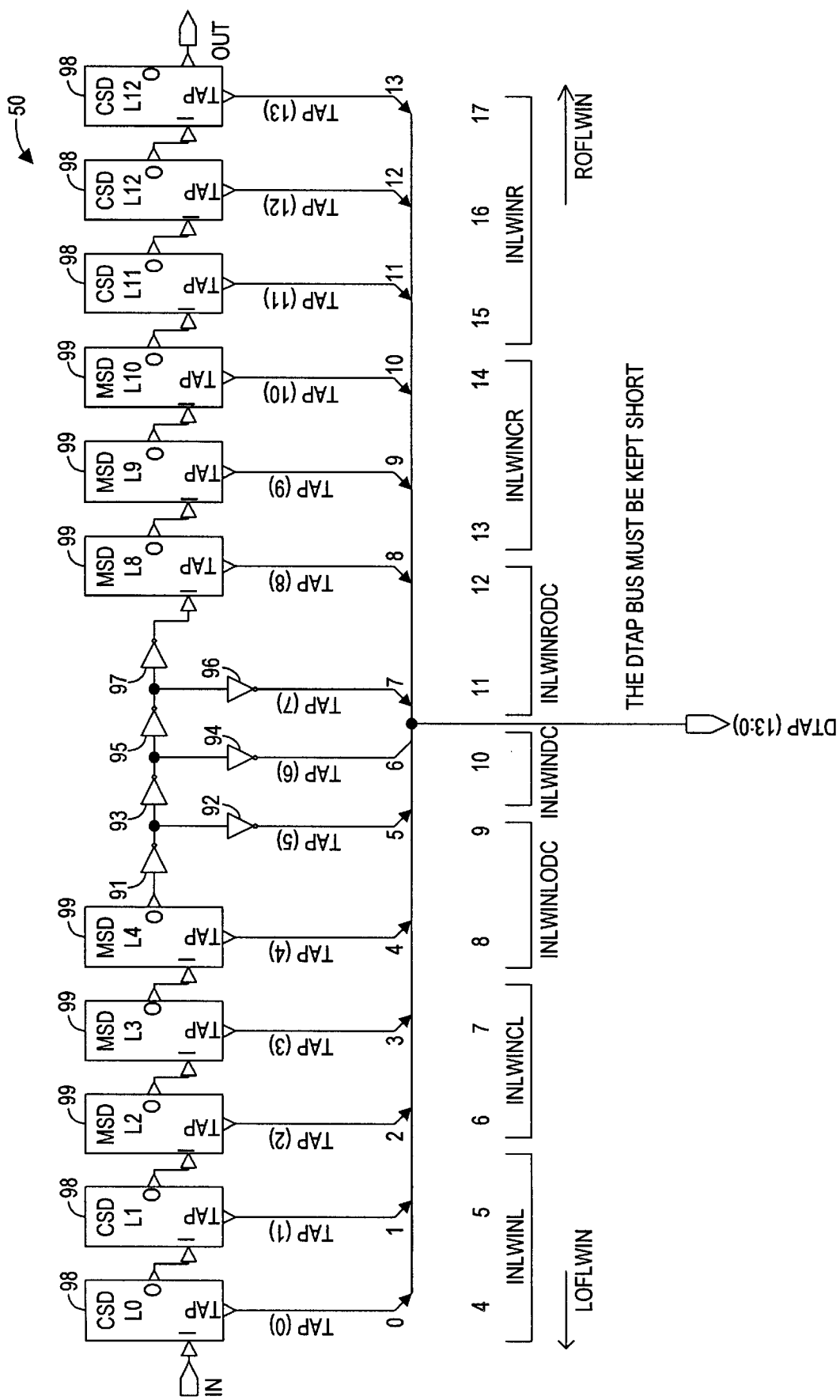
FIG. 4 is a schematic diagram of a lock window unit that includes a plurality of tap points arranged such that the position of the rising edge of a pulse waveform can be located.
Figure 5:
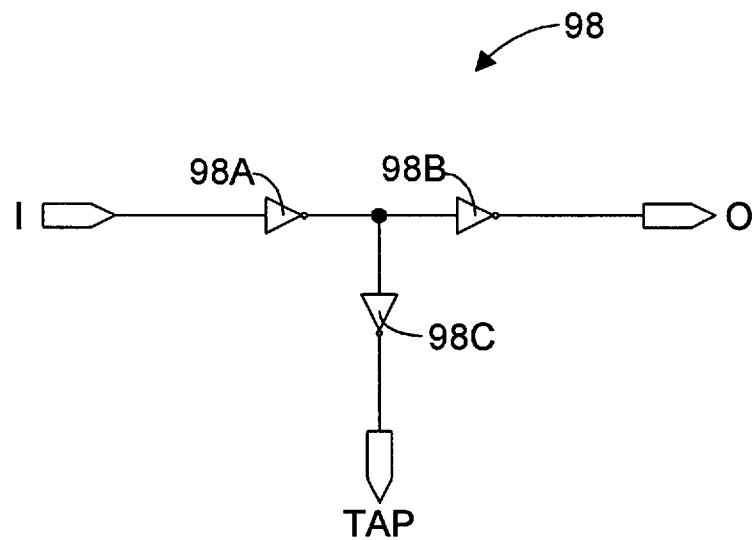
FIG. 5 is a schematic diagram of a coarse delay unit.
Figure 6:
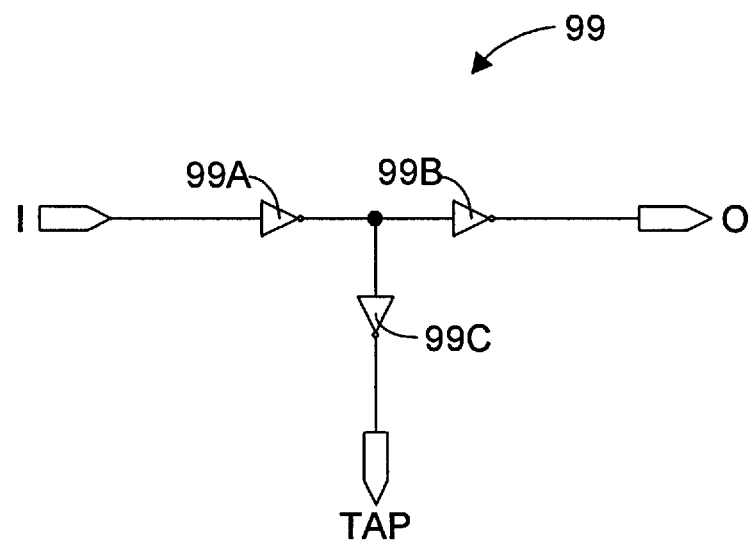
FIG. 6 is a schematic diagram of a medium delay unit.

Referring to FIG. 4, a schematic diagram is shown of the lock window unit 50. It is evident that the lock window unit 50 itself is a delay chain made up of various delay elements. These delay elements include inverters 91–97, a plurality of coarse delay units 98 labeled CSD, and a plurality of medium delay units 99 labeled MSD. FIG. 5 is a schematic diagram illustrating each CSD unit 98, and FIG. 6 is a schematic diagram illustrating each MSD unit 99. The CSD units 98 and MSD units 99 in this embodiment each include a pair of series connected inverters (98A, 98B, 99A, 99B) with a third inverter (98C, 99C) providing a tap point. The CSD units 98 are designed in this embodiment to have a propagation delay about five times that of the MSD units 99. The MSD units 99 in turn have a delay approximately equal to two normal inverters. That is, the inverters 98A and 98B of the CSD units 98 each have a delay approximately five times the delays of inverters 99A and 99B of the MSD units 99, and inverters 99A and 99B are designed to have a delay equal to the normal logical inverters fabricated on the integrated circuit.

As the pulse travels through the lock window 50, it passes into the I input of the respective CSD and MSD units and passes out through the O output. The O output of each CSD and MSD unit is coupled to the I input of the next element in the delay chain. In the approximate center of the lock window 50 are discrete inverters 91–97. From the arrangement of the delay elements in the lock window 50 it is evident that the resolution in the lock window is finer near the center of the window and more coarse at the ends. The discrete inverters 91–97 used at the center of the window serve to maximize the resolution at that point.

Figure 7:
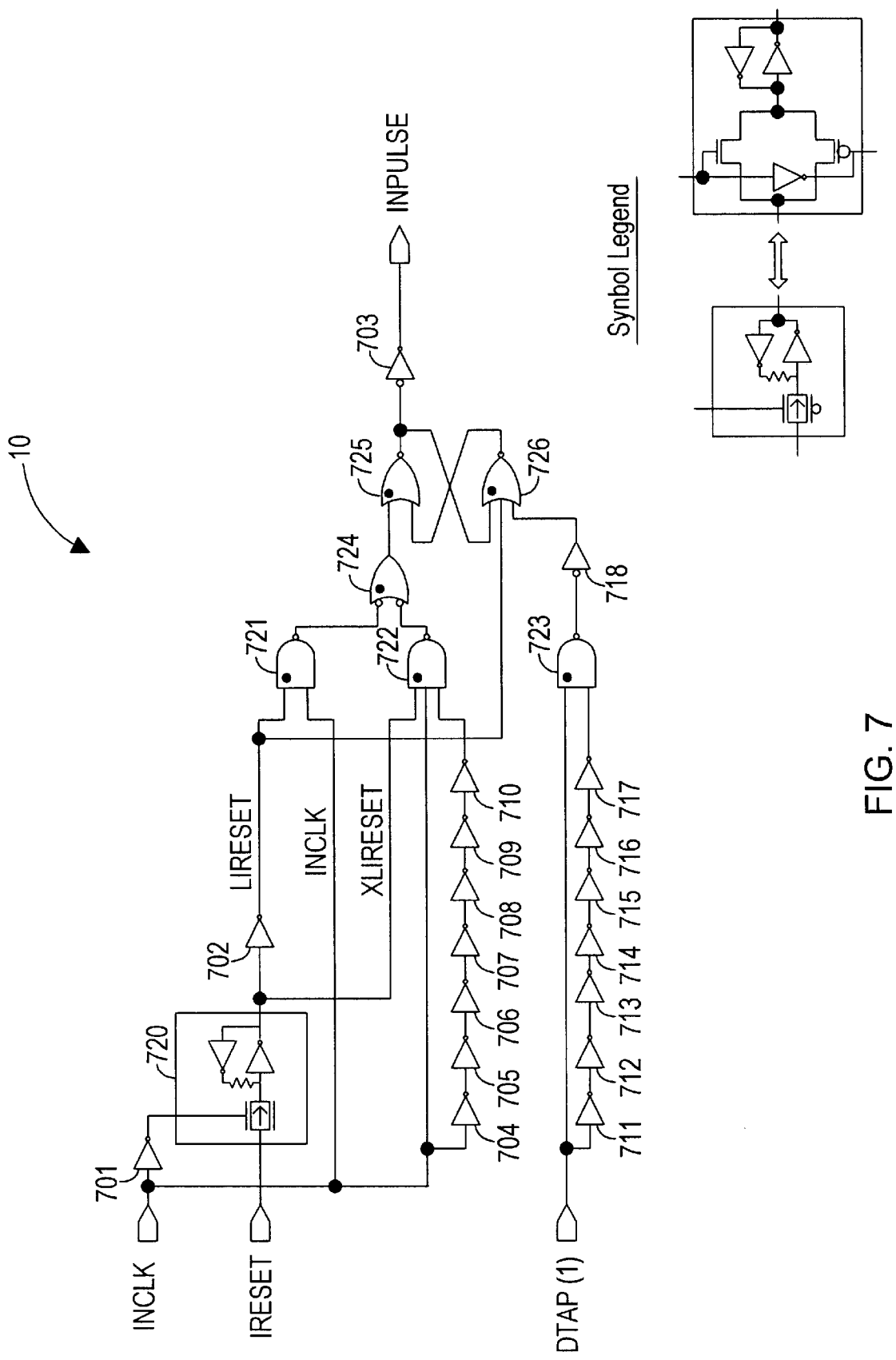
FIG. 7 is a schematic diagram of a pulse generator block that receives an external clock signal and generates a pulse that is provided to a delay chain.

As stated previously with reference to FIG. 1, the PULGEN block 10 generates a continuous stream of pulses that are sent down the VDEL delay chain and through the lock window 50 coupled to the end of the VDEL chain. FIG. 7 is a schematic diagram illustrating the PULGEN unit 10. The circuit includes a plurality of inverters 701–718, a latch 720, NAND gates 721–724, and NOR gates 725 and 726.

It is noted that NOR gates 725 and 726 form a second latch circuit. When signal IRESET is high, the microprocessor is in a reset mode. Therefore, the output line of NAND gate 722 is held high and the output line of NOR gate 726 remains low regardless of signal DTAP(1). Signal INPULSE is therefore directly derived from signal INCLK as the result of the switching of the output states of NAND gates 721 and 724.

When signal IRESET goes low, the output of NAND gate 722 goes low for a short duration upon the next rising edge of signal INCLK. This causes the output of NAND gate 724 to go high, thereby latching signal INPULSE high. When signal INCLK goes low, the output of NAND gate 722 remains high, as does signal INPULSE. When signal DTAP (1) goes high, NAND gate 723 pulses low momentarily, thereby driving the output of NOR gate 726 low. This latches the output of NOR gate 725 high, thereby causing signal INPULSE to go low. Signal INPULSE will return high upon the next rising edge of signal INCLK.

It is noted that the INPULSE waveform has a period identical to that of signal INCLK. In the steady state, the INPULSE waveform has a duty cycle that is close to 50%. This is not critical to the operation of the clock generator, but simplifies the design of the clock generator. The 50% duty cycle is achieved by forcing signal INPULSE to go high upon the rising edge of signal INCLK and forcing it to go low upon the rising edge of signal DTAP(1). DTAP(1) is halfway down the VDEL chain. Therefore, since in the steady state the VDEL chain length has been adjusted to match the period of signal INCLK, signal INPULSE will go low half an INCLK period after it goes high. It is also noted that since only the rising edges of the signals EDELOUT (3:0) are used for timing reference, the propagation delay of the falling edge of the traveling pulse (INPULSE) is not critical.

Referring back to FIG. 1, the eighteen tap points from the delay chain are latched in the sampling latch unit 60 (SAMPLAT). These tap portions are latched upon the occurrence of a delayed version of the rising edge of signal INPULSE. The reason for this delay is as follows. When the "current" rising edge of signal INPULSE is arriving at the input of the first VDEL unit 40A, the previous rising edge of signal INPULSE has propagated down the chain and is leaving the fourth VDEL unit 40D. In order to determine the location of this previous pulse with high resolution, the sampling latch unit 60 delays the rising edge of the current pulse of signal INPULSE by an amount exactly equal to the delay between the beginning and the middle of the lock window unit 50. When this slightly delayed rising edge (called signal XDINCLK in the sampling latch unit 60 of FIG. 8) is used to latch the delay chain taps, the delayed previous edge location in the chain has the same temporal relationship to the output of the fourth VDEL unit 40D as the delayed current edge has to the input of the first VDEL unit 40A. Thus the 18-bit latched tap point vector is an image of the previous edge in the chain. When the delay through the 4 VDEL units 40A–40D matches the INCLK period, then the center of the latched lock window corresponds to exactly one INCLK period after the current rising edge of signal INPULSE enters the first VDEL unit 40A.

Figure 8:
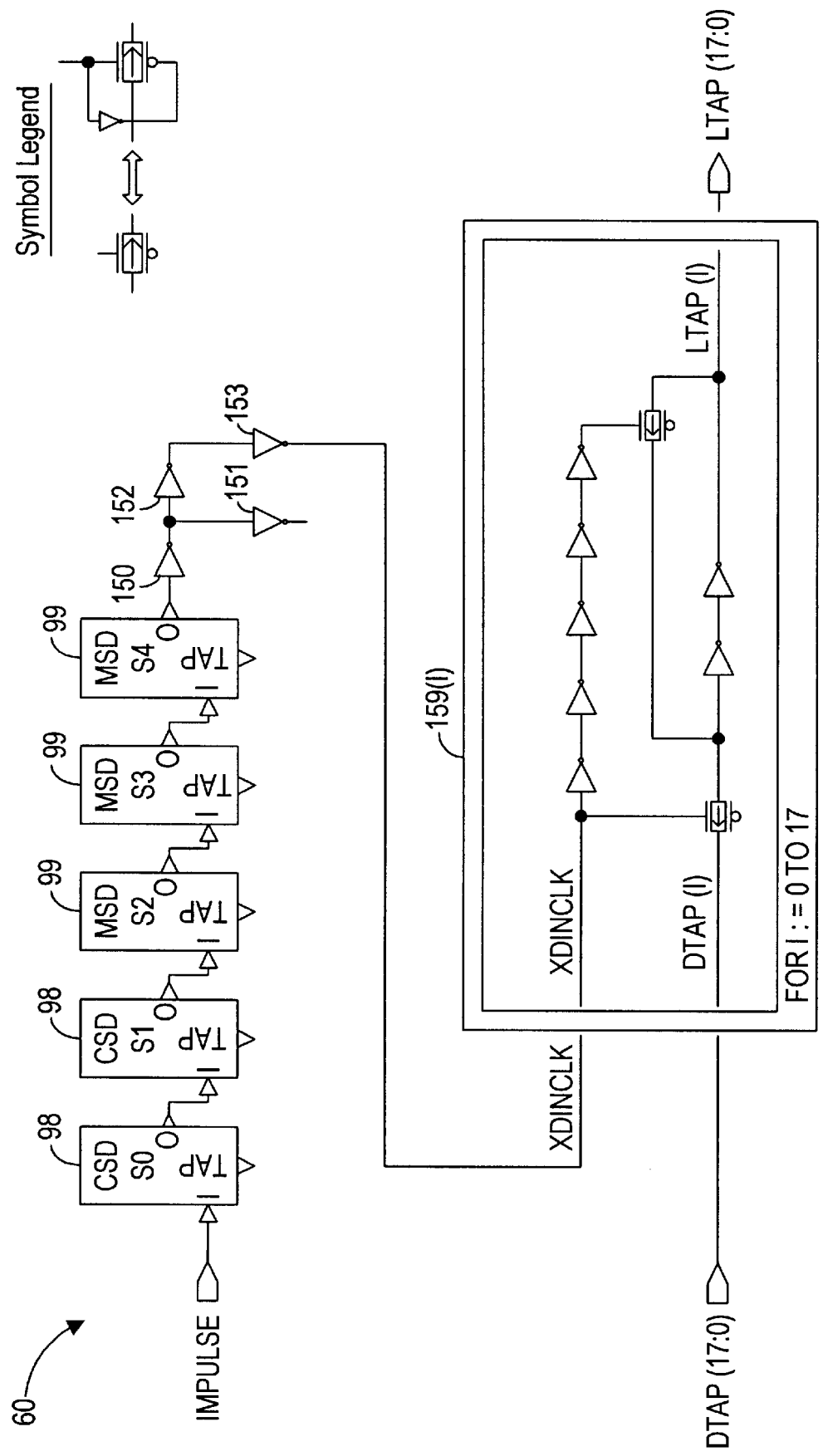
FIG. 8 is a schematic diagram of a sampling latch circuit that samples the tap points along the delay chain. The latched vector of tap points is analyzed in a state machine to determine how the length of the delay chain should be changed.

FIG. 8 is a schematic diagram illustrating the sampling latch unit 60. The circuit includes a pair of coarse delay units 98 labeled CSD, three medium delay units 99 labeled MSD and inverters 150–153. It is noted that these delay components are identical to those within the first half of the propagation path within the lock window unit 50. The circuit further includes eighteen separate latch units 159(I) (where I=0, 1, ... 17), each having an input line coupled to one of the eighteen lines of the bus DTAP(17:0). Each of the latch circuits 159(I) also includes an output line coupled to a separate line of a bus LTAP(17:0).

It is noted that each of the latches 159(I) latches a new tap value upon the rising edge of signal XDINCLK. As stated previously, signal XDINCLK is a version of signal INPULSE that is delayed by an amount exactly equal to the delay between the beginning and the middle of the lock window unit 50. As a result, the delayed previous edge location of a pulse in the delay chain has the same temporal relationship to the output of the fourth VDEL unit 40D as the delayed current edge has to the input of the first VDEL unit 40A. It is also noted that the first CSD unit 98 within the sampling latch unit 60 should be positioned near the location where signal INPULSE enters the first VDEL unit 40A. Furthermore, the lines comprising the bus DTAP(17:0) should be kept short. Signal XDINCLK should also be routed across the eighteen latches 159(I) from bit 17 to bit 0, in that order. These features may help to ensure that the tap vector is latched at the proper time.

When the latched delay taps LTAP(17:0) indicate that the rising edge of the traveling pulse was between LTAP(9) and LTAP(11) (also labeled TAP(5) and TAP(7) respectively in FIG. 4), then the delay chain comprised of the VDEL units 40A–40D has been adjusted so that its length matches the period of signal INPULSE (and therefore of signal INCLK). The delay chain is said to be "in lock" at this point.

If the chain is "in lock" and the latched delay tap vector (bus LTAP(17:0) in FIG. 1) is examined, logical low signals (zeros) will be to the right of the center of the lock window. The rising edge has not propagated there yet. To the left of the center of the lock window will be logical high signals (ones); the rising edge has gone by and the traveling pulse is high in that part of the chain. Further to the left of the lock window, at DTAP(1), will be seen a zero. This is the next falling edge propagating through the chain. The "current" rising edge will have propagated into the first VDEL unit 40A (since the LTAP(17:0) vector was latched with a delayed version of INPULSE). The current rising edge may or may not have propagated to the DTAP(0) point, depending on the frequency of the input clock and the speed of the delay chain. Note that in the center of the lock window there is only one inversion between tap points 9, 10 and 11 (also labeled 5, 6 and 7 in FIG. 4). Because of this, the sense of tap point 10 is inverted relative to the other tap points. This inversion occurs in the control unit 70.

If the delays of the VDEL units 40A–40D have been adjusted so that the cumulative delay through all four VDEL units is less than the period of signal INCLK, then the latched tap vector (LTAP, FIG. 1) will indicate that the rising edge location is to the right of (after) the center of the lock window. If the VDEL delay is small enough, the edge will not be seen in the lock window at all; it has passed beyond the lock window before the next rising edge of signal INPULSE latches the delay taps. Likewise, if the VDEL delays are larger than that necessary to match the period of signal INCKL, the rising edge of the traveling pulse will appear to the left of (before) the center of the lock window.

The location of the rising edge in the latched delay tap vector is therefore an indication of how closely the cumulative VDEL delay matches the INCLK period. The state of the LTAP vector is used to make a decision about modifying the delay of VDEL units 40A–40D. This decision-making logic is located in the control block 70. The control block 70 produces four vectors that together determine the amount of delay in each VDEL unit: CSDSEL(9:0), MSDSEL(9:0), FSDSEL(9:0) and FSDUPD(3:0).

Figure 9:
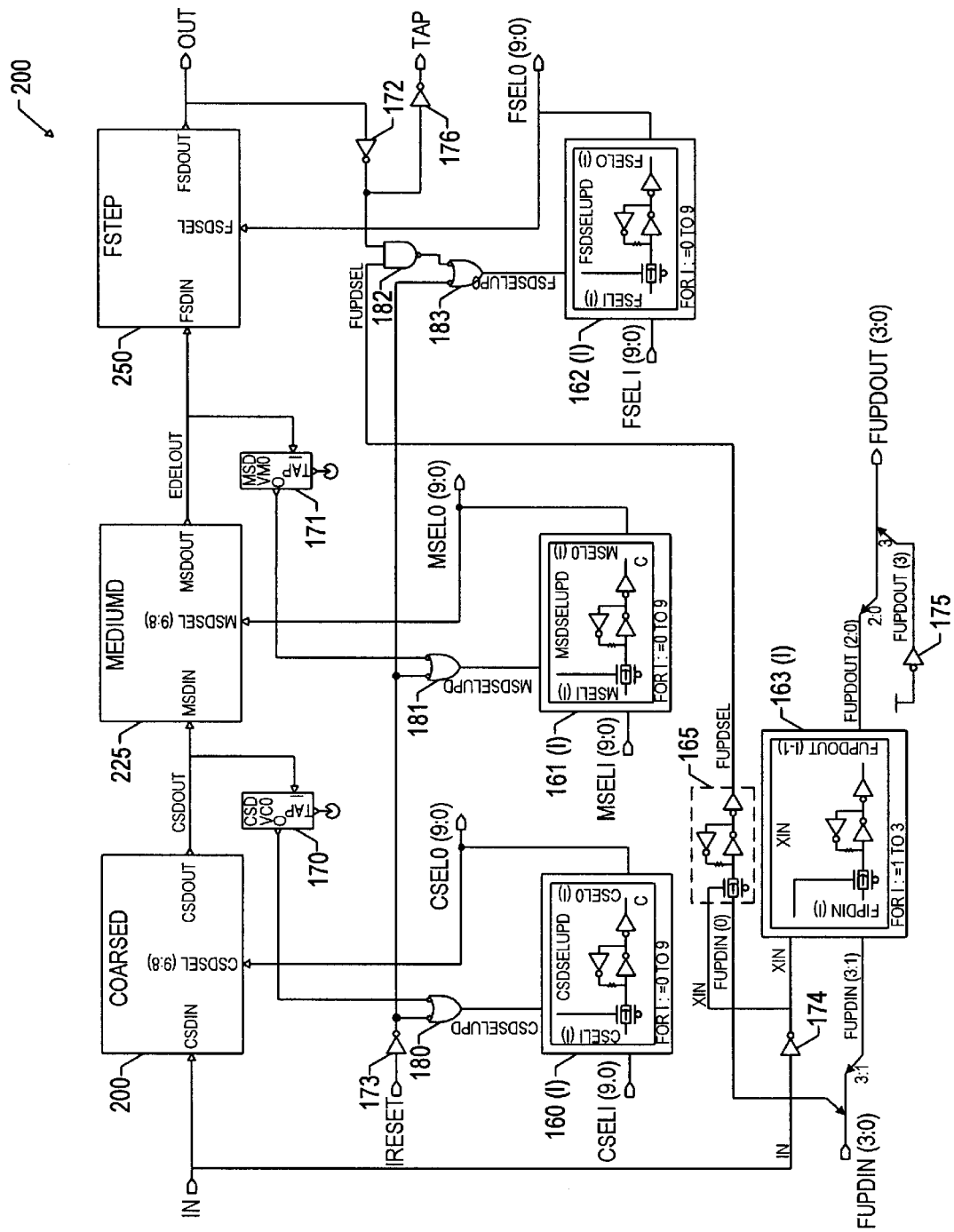
FIG. 9 is a schematic diagram of a variable length delay circuit.

The internal components of the VDEL units 40A–40D are next considered with reference to FIGS. 9–12. Referring first to FIG. 9, in this embodiment each VDEL unit has three primary delay components. A first of these components is a coarse delay adjust circuit 200 (COARSED) that varies the delay through the unit in coarse steps. A second component is a medium delay adjust circuit 225 (MEDIUM) that varies the delay through the unit in medium steps. The last component is a fine delay adjust circuit 250 (FSTEP) that varies the delay in fine steps. Each of these three components receives a 10-bit delay select vector as an input. These vectors control the length of the delay through the three components.

The VDEL unit of FIG. 9 also includes three sets of latch circuits 160(I), 161(I), and 162(I) (where I=0, 1, ... 9), and a fourth set of latches 163(I) (where I=1, 2 and 3). The VDEL unit further includes a latch 165, a coarse delay unit (CSD unit) 170, a medium delay unit (MSD unit) 171, inverters 172–176, and NAND gates 180–183.

Figure 10:
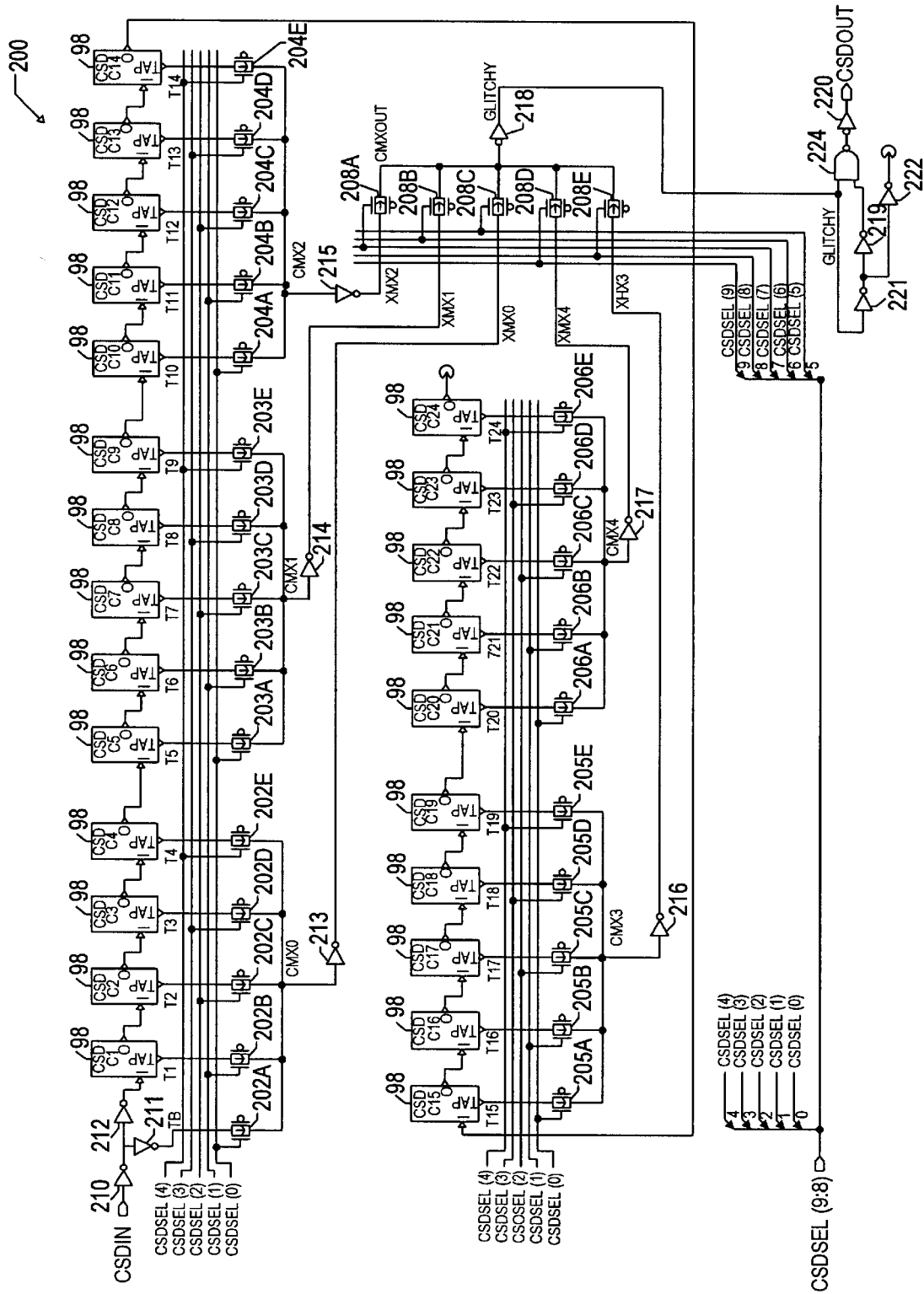
FIG. 10 is a schematic diagram of a coarse delay adjust circuit within the variable length delay chain that allows coarse delay increments.

Referring to FIG. 10, a schematic diagram is shown of the coarse delay adjust circuit 200 (shown initially in FIG. 9). The circuit includes a plurality of coarse delay units (CSD units) 98, each including a tap terminal coupled to a separate transfer gate that is controlled by one of five signals (CSDSEL(4:0)) on the CSDSEL bus. It is noted that the 10-bit delay select vector CSDSEL(9:0) is used to select one of 25 tap points in a chain of CSD delay units 98. As mentioned earlier, a CSD unit 98 is a pair of inverters designed to have a relatively long propagation delay (see FIG. 5). In this embodiment, the selection is performed in two stages. One of five second-level multiplexer outputs is chosen with signals CSDSEL(5:9) through the control of transfer gates 208A–208E. A first-level multiplexer formed by transfer gates 202A–202E, 203A–203E, 204A–204E, 205A–205E, and 206A–206E selects one of five tap points using the CSDSEL(4:0) delay select signals. Thus, as a result of this configuration, the range of the delays selectable in the coarse delay adjust circuit 200 is from about one to about twenty-five CSD units. This range is not exactly one to twenty-five units since the delay of the first delay element formed by inverters 210–212 is not as long as the delay of a CSD element. This is provided to minimize the smallest coarse delay that is selectable. Inverters 219–222 and NAND gate 224 are provided to filter extraneous "glitches" or pulses, as will be explained in more detail below.

Figure 11:
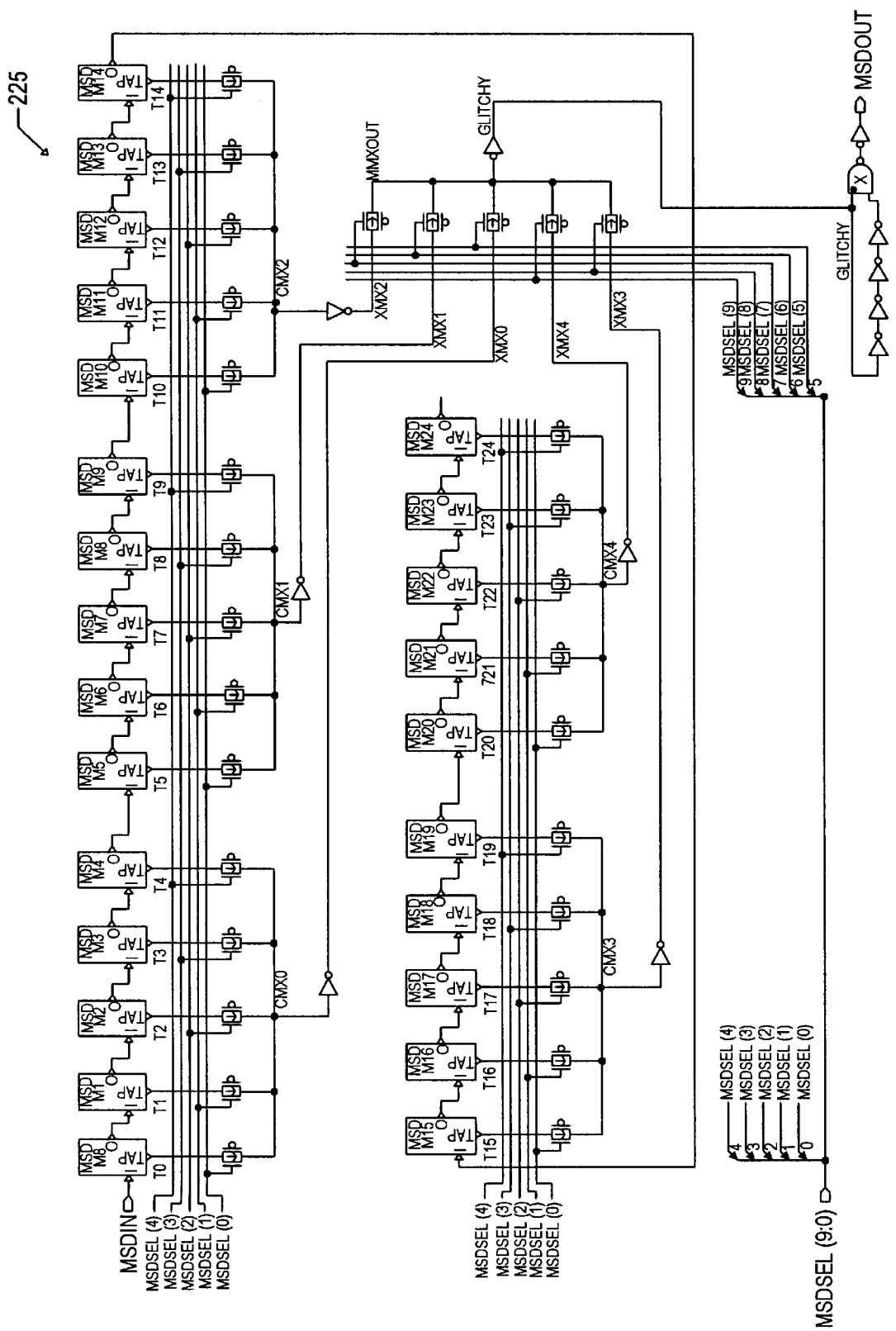
FIG. 11 is a schematic diagram of a medium delay adjust circuit within the variable length delay chain that allows medium delay increments.

FIG. 11 is a schematic diagram illustrating the medium delay adjust circuit 225. It is noted that this circuit is implemented identically to the coarse delay adjust circuit 200 but with MSD units 99 incorporated in the place of the CSD units 98. An MSD unit 99 delay in this embodiment has about one-fifth the delay of a CSD unit 98. The 10-bit delay select vector MSDEL(9:0) is used to select one of twenty-five tap points in a chain of MSD delay units 99. As a result of this configuration, the range of delays selectable in the medium delay adjust circuit 225 is from one to twenty-five MSD units.

Figure 12:
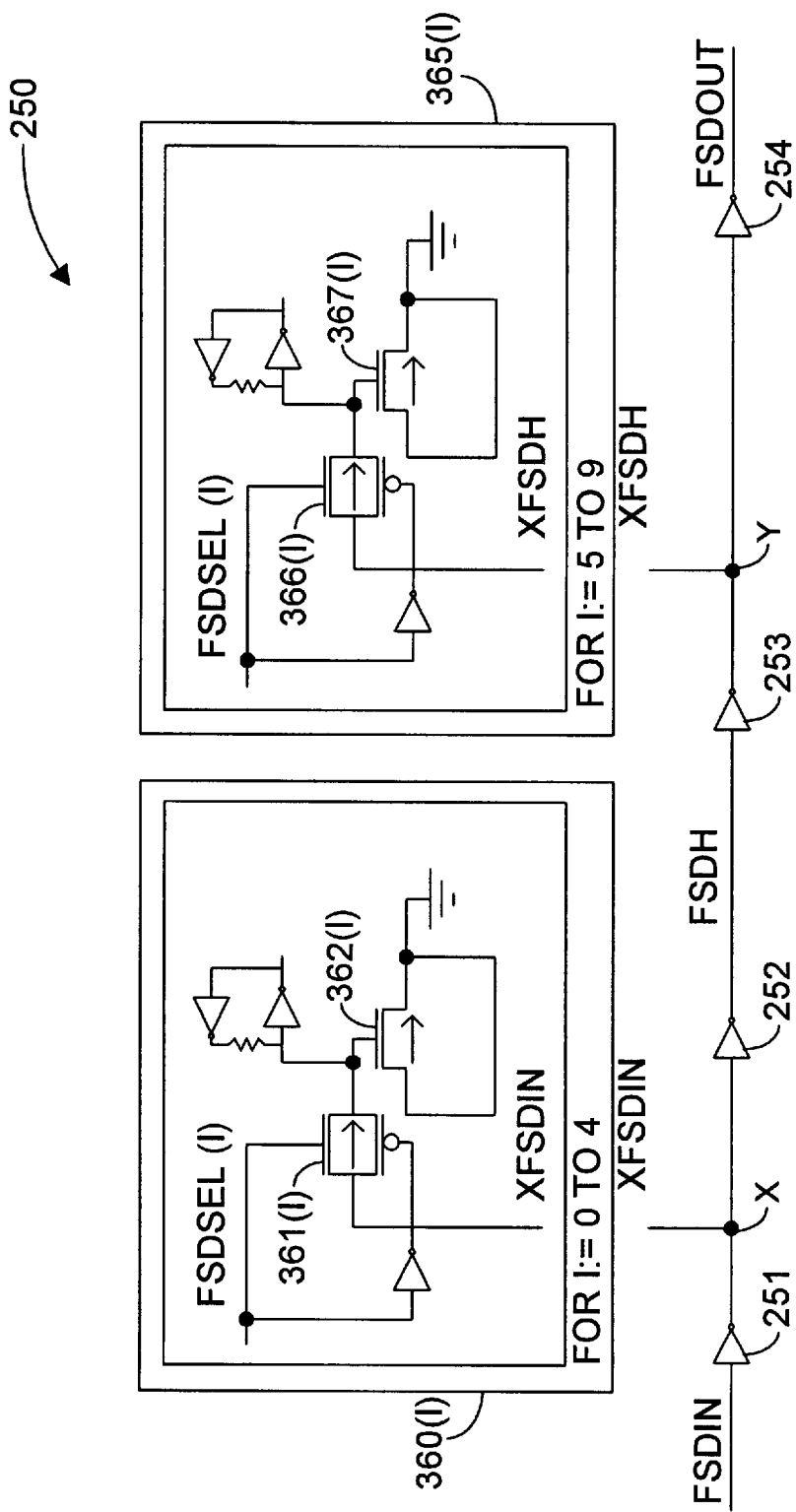
FIG. 12 is a schematic diagram of a fine delay adjust circuit within the variable length delay chain that allows fine delay increments.

FIG. 12 is a schematic diagram that illustrates the fine delay adjust circuit 250. The fine delay adjust circuit 250 is constructed such that the VDEL delay can be controlled with a resolution of less than an inverter delay. In this embodiment the fine delay adjust circuit 250 includes a short inverter chain consisting of inverters 251–254. Two of the nodes (X and Y) in the chain are connected to a set of switching circuits 360(I) (where I=0, 1, . . . 4) and 365(I) (where I=5, 6, . . . 9). Each switching circuit 360(I) includes a transfer gate **361(*i*) that is controlled by signal FSDSEL(I). When the respective transfer gate 361(I) is turned on, a capacitance formed by a transistor 362(I) is connected between node x and ground. Similarly, each switching circuit 365(I) includes a transfer gate 366(I) that is controlled by signal FSDSEL(I) (where I=5, 6, . . . 9). When the respective transfer gate 366(I) is turned on, a capacitance formed by a transistor 367(I)** is connected between node Y and ground. By switching in more capacitance, the delay through the FSTEP component can be increased and vice-versa. In this embodiment the FSTEP delay steps are about one-fifth of an MSD unit delay.

Referring back to the diagram of a VDEL unit shown in FIG. 9, it can now be seen that the delay through a VDEL unit can be controlled with a resolution of one FSTEP delay unit over a rather large range by selecting various combinations of coarse, medium and fine delays. The broad range of delays that can be selected is necessary to support a range of microprocessor frequencies and to do so over the semiconductor process window and operating conditions window.

Referring back to FIG. 1, the coarse delay in each VDEL unit 40A–40D is specified every cycle of signal INCLK by the CSDSEL(9:0) bus from the control unit 70. Likewise, the MSDSEL(9:0) bus specifies the medium delay. The FSTEP units and their associated control buses, FSDUPD (3:0) and FSDSEL(9:0), specify the fine delay, and can actually provide two levels of control of the VDEL chain delay. These are designated fine and extra-fine. The timing of the delay control buses will be described next.

The delay tap vector DTAP(17:0) is sampled by the sampling latch 60 with the rising edge of signal INPULSE every INPULSE cycle. The control unit 70 monitors latched this vector and together with a set of stored state information, makes a decision about whether to adjust the delay chain length and if so, by how much and in which direction. Each of the four delay-control buses controlled by the control unit 70 change state following a subsequent falling edge of signal INPULSE. It is noted that control unit 70 is a state machine that operates in accordance with the following description. An actual circuit-level implementation of the control unit 70 will be disclosed later.

The states of the delay control buses (also referred to simply as delay selects hereinafter) may change very soon after the falling edge of signal INPULSE. At this time, the INPULSE falling edge is propagating through the first VDEL unit 40A. To prevent the generation of extraneous pulses in the delay chain, the delay selects received by the delay components inside the VDEL units 40A–40D must not be allowed to change while the rising or falling edge of a pulse is traveling through that part of the delay chain. Latches are provided in each VDEL unit 40A–40D to ensure that this is the case. The latches function as follows. Referring to FIGS. 1 and 9, the coarse delay select lines from control unit 70 are received by the first VDEL unit 40A and are coupled to a set of latches 160(I), where I=0, 1, 2, . . . 9. The latches 160(I) (with outputs CSELO(9:0)) are opened a short time after the CSDOUT signal (provided from the coarse delay adjust circuit 200) goes low. As long as the CSDSEL bus from control unit 70 becomes stable a short time after the falling edge of signal INPULSE the delay selects seen by the coarse delay adjust unit 200 of the first VDEL unit 40A will be stable before the next rising edge of signal INPULSE begins propagating through that COARSED unit 200. The output of the latches 160(I) in the first VDEL unit 40A becomes the input to the equivalent latches in the second VDEL unit 40B. Thus, the coarse delay select signals seen by a COARSED unit 200 only change after a falling edge has passed through that unit and before the next rising edge passes through. The same type of latching is performed on the medium step delay control bus, using latches 161(I). The fine step delay control is somewhat modified, as explained below.

Referring to FIG. 10, it is evident that the rising edge of the output signal of the COARSED delay chain is delayed by inverters 218–222 and NAND gate 224 before it leaves the COARSED unit 200. This is to filter out an extraneous pulse that can be generated by switching the delay select lines seen by the COARSED unit 200 immediately after a falling edge comes out of that unit. This extraneous pulse arises because while the falling edge may have left the COARSED unit 200, it may not yet have reached the delay stage in the COARSED unit 200 that had been newly selected as the end of the COARSED delay chain. If the delay select lines are causing the delay chain to be increased by one CSD unit, then a small pulse may be generated as the chain is increased in length while the falling edge is still passing through the CSD unit 98 that is being added to the chain. As shown in FIG. 9, the CSD unit 170 in each VDEL unit (that has CSDOUT as its input) addresses the same problem in a slightly different way; the delay select line of latch 160(I) is not allowed to open until one CSD propagation delay after signal CSDOUT goes low.

The same techniques are used to prevent extraneous pulses from being generated by the medium delay adjust unit 225 of each VDEL unit 40A–40D; the delay select line of latch 161(I) is not allowed to open until a MSD propagation delay after EDELOUT goes low. This delay is provided by the MSD unit 171. Only a small delay formed by inverter 172 is needed between the output of the fine delay adjust unit 250 and its associated delay control bus latch 162(I).

The latching of the fine step delay control bus is modified to provide a finer level of resolution to the overall VDEL delay chain length. To understand the method for achieving this "extra-fine" delay step resolution, it is important to realize that when a unit of delay is added to or subtracted from each VDEL unit 40A–40D (whether "coarse", "medium" or "fine") the overall VDEL chain length changes by N times that unit of delay, where N is the number of VDEL units (4 in this embodiment).

The extra-fine delay step resolution is achieved by allowing the fine step delay chain in only one VDEL unit to change at a time. In the embodiment shown, this function is performed in the following manner. The FSDUPD(3:0) bus specifies which VDEL units 40A–40D will use the present cycle's FSDSEL delay control bus to specify the FSTEP unit's delay. If a VDEL unit 40A–40D is not to use the present cycle's FSDSEL vector, then the previous cycle's fine step delay vector is used instead. The previous cycle's fine step delay vector is held in the same latch that provides for the proper timing of the control vector to each of the VDEL units. For this reason, if a certain VDEL unit 40A–40D does not update its fine-step delay select latch, the VDEL units after that one do not either (since the fine-step delay select vector is latched in a serial fashion in each of the VDEL units). The algorithm used to control the latching of the fine step delay select vector will be discussed in more detail below.

The algorithm used to keep the delay chain adjusted such that the delay chain length remains equal to the period of signal INCLK is next considered. The initialization of the delay chain is discussed in a later section. It should be noted that a variety of alternative algorithms suitable for controlling the delay chain are possible, and that a variety of variations to the present algorithm are also possible. The employment of such alternative algorithms or variations do not depart from the spirit and scope of the invention.

The latched delay tap vector, LTAP(17:0) as illustrated in FIG. 1 is a snapshot of the delay chain state a short time after the rising edge of signal INPULSE. To detect where the previous pulse's rising edge is in the delay chain, bits 1 through 16 are each ANDed with the complement of the next higher bit (bit 1 AND not(bit 2), for example). The output vector of this ANDing operation is referred to as EDGELOC (16:1). The adjust algorithm operates such that there is never more than one rising edge in the delay chain (not counting the first two VDEL units, which may have the "current" rising edge in them—this is why LTAP(0) is not examined). Therefore, all bits of the EDGELOC vector should be zero except for at most one bit being one. If a bit of the vector is one, then the rising edge was between the corresponding delay tap and the next delay tap at the time the delay tap vector was latched. For example, if EDGELOC(4) is true, it is because LTAP(4) is true and LTAP(5) is false. This implies that the rising edge had passed DTAP(4) but not yet reached DTAP(5) when the DTAP vector was latched.

The EDGELOC vector then indicates the location of the rising edge of the pulse in the delay chain every cycle by a bit of the vector being set. The EDGELOC vector is divided into regions as indicated in Table I below.

TABLE I

| region name | EDGELOC bit(s) | description |
|---|---|---|
| LOFLWIN | 3:1 | left of lock window |
| INLWIN | 16:4 | in lock window |
| INLWINL | 5:4 | in left end of lock window |
| INLWINCL | 7:6 | in left of center of l.w. |
| INLWINLODC | 9:8 | left of dead center of l.w. |
| INLWINDC | 10 | in dead center of l.w. |
| INLWINRODC | 12:11 | right of dead center of l.w. |
| INLWINCR | 14:13 | in right end of center of l.w. |
| INLWINR | 16:15 | in right end of lock window |
| ROFLWIN | (none) | in right of the lock window |

In this description "left" indicates before and "right" indicates after. The schematics are shown such that the pulses travel from left to right through the various parts of the delay chain. The exact number of regions and how they are defined is not critical. The purpose is to categorize and name regions of the delay chain to make the algorithm clear.

In the present embodiment, the control unit 70 considers the present state of the EDGELOC vector and sometimes the previous cycle's state of this vector for the purpose of making an adjustment to the delay chain length. It may in some applications be desirable to store the states of additional previous cycles to take into account a longer history of previous edge locations and a history of previous adjustments taken.

An important goal in adjusting the delay chain is to minimize the jitter that is introduced in the period and duty cycle of the synthesized clocks. Jitter in this case is a change in the period of duty cycle of the synthesized clocks from one cycle to the next. This design goal is balanced by the need to keep up with rapid and extreme changes in environmental parameters such as temperature and operating voltage.

When the rising edge is immediately to the left or right of the dead center of the lock window (regions INLWINRODC and INLWINLODC), delay length changes are only made in extra-fine steps to minimize jitter. The algorithm can be changed easily such that the edge must be located in one of these regions for more than one cycle before any action is taken to change the delay length, but this should be balanced with the need to keep up with some maximum anticipated rate of change of the delay chain length due to environmental parameters. In the steady state, the rising edge should never leave one of the three regions INLWINLODC, INLWDC or INLWINRODC immediately surrounding (and including) the dead center of the lock window.

For robustness, allowance is made for the possibility that the edge could leave the immediate center of the lock window. As the edge is found farther away from the center, larger steps in the delay adjustment are taken to bring the edge back near the center. The adjustment type taken for each region is listed in Table II below.

TABLE II

| Region Name | EDGELOC bit(s) | Type of Adjustment Made |
|---|---|---|
| LOFLWIN | 3:1 | medium step (see note 1) |
| INLWINL | 5:4 | fine step (note 2) |
| INLWINCL | 7:6 | fine step (note 2) |
| INLWINLODC | 9:8 | extra-fine step (note 2) |
| INLWINDC | 10 | no action taken |
| INLWINRODC | 12:11 | extra-fine step (note 2) |
| INLWINCR | 14:13 | fine step (note 2) |
| INLWINR | 16:15 | fine step (note 2) |
| ROFLWIN | (none) | medium step (see note 1) |

Note 1
the edge must be in these regions for two consecutive cycles before any action is taken.
Note 2
fine and extra-fine adjustments are only made once every second cycle. This is because of the delay between making an adjustment and seeing the effects of that adjustment. The delay adjustment is stabilized somewhat by this, though the response to rapid changes in environmental conditions is limited slightly.

The number of cycles between fine and extra-fine adjustments and the number of cycles that the edge is in a particular region before taking action are algorithm parameters that can be made variable. These parameters can be mask programmable, software programmable or can be modified automatically by the delay adjust algorithm. In this particular embodiment, these parameters are fixed.

It can be seen from FIGS. 10, 11 and 12 that the coarse, medium and fine delay ranges are limited. Even though environmental parameters such as temperature vary slowly, they can vary over a large range. In the steady state, it is quite likely that a certain type of delay (fine, for example) will be adjusted until no further adjustment is possible.

When this happens, "wrapping" occurs. Wrapping is the increment or decrement by one of the next coarser delay units and a simultaneous compensating decrement or increment (respectively) of the delay unit that has reached the extent of its range. In this embodiment, the coarse delay units (CSD) 98 are designed to have a propagation delay five times that of a medium delay unit (MSD) 99. Similarly, an MSD propagation delay is designed to be five fine step delay units. Therefore, the delay that has reached the extent of its range is incremented or decremented by five to compensate for the decrement or increment (respectively) of the next coarser delay.

The amount of jitter seen in the synthesized clocks is a function of how closely the wrapping of a delay compensates for a change in the next coarser delay. As the intrinsic delay through the delay chain becomes smaller due to lower temperature, increased operating voltage or because the semiconductor process has produced a relatively fast chip, the jitter due to wrapping will become smaller. That is because both delay types involved in the wrapping become smaller by about the same ratio and so the difference between them is smaller. It should also be noted that the jitter as a percent of the period is also smaller for large periods.

In order to minimize jitter while keeping the number of delays in the medium delay chains relatively small, the medium delay is kept near the upper end of its range in the steady state. This minimizes jitter because adjustment of the coarse delay (and the associated wrapping of the medium delay) occurs only when there is a certain minimum number of medium steps in the chain. There are several reasons for there to be a certain minimum number of medium delay steps in the chain. One is that the operating frequency may be relatively low (compared to the designed maximum operating frequency). Another is that the temperature may be relatively low or that the particular microprocessor chip was manufactured in a fast corner of the semiconductor process window. In each of these cases, jitter is reduced. Thus jitter is reduced when the delay chain has more delay selected (and is near the center of the lock window). By keeping the medium delay near the upper end of its range, a coarse delay change is only needed when jitter is smaller due to one of the reasons mentioned above.

In the present embodiment, both the coarse and medium delay ranges are from one to twenty-five. The medium delay is wrapped down by five and the coarse delay is incremented by one if the medium delay is in the current state a twenty-four and more medium delay is needed. The medium delay is wrapped up by five and the coarse delay is decremented by one if the medium delay is at thirteen and less medium delay is needed.

The fine step delay has a range from zero to ten units. More or less medium step delay may be needed because the fine step delay has reached the end of its range. It is possible for medium delay to be at the limit of its range and the fine step delay to be at the limits of its range so that both medium and fine delays need to be wrapped. To limit the jitter caused by mismatches between the wrapping delay type and the next coarser delay type, this "double wrapping" is performed in stages. First the coarser wrapping operation takes place. The next finer wrapping takes place in a subsequent cycle if the need to do so still exists (the "jitter" induced by the first wrap may have been in the direction that eliminates the need for the next stage of wrapping).

It should be noted here that the jitter caused by mismatch between the coarse delay and the wrapping medium delay can be almost eliminated by constructing the coarse delay element out of five (in this case) medium delay elements, though this is expensive in terms of transistor count.

The manner in which extra-fine adjustments are made is next considered. As mentioned previously, the FSDUPD (3:0) signals control which of the VDEL units 40A–40D update themselves with the new FSDUPD vector. The FSDUPD vector controls the delay of the FSTEP (fine step) unit 250. The allowed values that signal FSDUPD can have and the interpretation of these values are indicated in Table III below.

TABLE III

| FSDUPD(3:0) | VDEL units updating FSTEP delay control |
| --- | --- |
| 0001 | VD0 |
| 0011 | VD0, VD1 |
| 0111 | VD0, VD1, VD2 |
| 1111 | VD0, VD1, VD2, VD3 |

Note that if a VDEL unit 40A–40D is allowing its associated FSTEP unit 250 to be controlled by the fine step delay vector, then the VDEL units to the left of that one are also being controlled by the fine step delay vector. This occurs since the new fine step delay vector is passed from VDEL unit to VDEL unit. It is noted that this implementation requires fewer latches, but that it would be possible with additional latches to have a more flexible update scheme for the fine step delay vectors.

The extra-fine step adjustment is performed as follows. Assume that in a certain cycle, signal FSDUPD is 1111 and the next cycle an extra-fine step adjustment is determined necessary. Signal FSDUPD is changed to 0001 and the fine step delay (specified by signal FSDSEL) is incremented or decremented by one fine step unit. VDEL units 40B, 40C and 40D will still respond to the old value of signal FSDSEL since they are not updated. VDEL unit 40A will on the other hand respond to the incremented or decremented FSDSEL signal and the VDEL chain as a whole will have its length changed by only one fine step unit. If, some number of cycles later, an additional change in the same direction is required (same direction meaning, for example, an extra-fine step increment followed by another extra-fine step increment), the FSDUPD signal is changed to 0011 while signal FSDSEL is kept unchanged. Now the first two units see the updated FSDSEL value and the overall delay has changed by another one fine step unit delay. This continues until signal FSDUPD is 1111 again and the sequence starts over again. No matter what state signal FSDUPD is in, if the delay adjustment changes direction, the signal FSDUPD is changed to 0001 and the FSDSEL is incremented or decremented. The delay adjustment is said to change direction if increment is required and the previous adjustment was a decrement or vice-versa.

Using this algorithm, the cumulative chain length can be constrained to change by not more than one fine step unit delay. If there are several direction reversals that occur fairly close together, it is possible that for some cycles, an extra-fine step adjustment is needed but is not taken since an FSTEP unit 250 is updated with a new fine step delay vector that happens to be the same as the one it had previously latched. This is of no real consequence, however, as rapid response is not needed and is actually undesirable if the direction of extra-fine step adjustments is changing frequently.

Note that if signal FSDUPD is 1111 and the FSDSEL vector is increased or decreased by one that the overall delay length is changed by four fine step unit delays. This is in fact how a fine step (in contrast to an extra-fine step) adjustment is made. In addition, when the fine step delay is being wrapped, the FSDUPD value is 1111 so that the fine step delay change can compensate correctly for the medium step delay change.

The initialization of the delay chain is next considered. Initialization of the delay chain takes place when the microprocessor is reset or when the microprocessor is coming out of a power-saving state (to be described later).

During initialization, the delay chain is not used to generate the processor or system clocks. This is because the delay chain length is likely to be significantly different than the input clock period and may produce clocks with unacceptable duty cycles. Instead, the synthesized clocks are forced to be divided down from the input clock by conventional logic. Because the synthesized clocks are divided down from the input clock, both the duty cycle and the period of the synthesized clocks are determined by the period of the input clock (which is well-controlled). In this way, initialization of the system and the rest of the processor can proceed reliably. When the delay chain has stabilized itself, the clock waveforms begin to be synthesized by the delay chain timing reference signals, as programmed.

At the beginning of initialization, signal INPULSE is controlled to have a duty cycle and period that corresponds to those of signal INCLK. This is to provide for reliable initialization of the waveform in the delay chain. Signal INPULSE is strictly a function of signal INCLK during reset of the microprocessor or for a short time when leaving a power-saving state. After the processor leaves the reset state or a short time after leaving a power-saving state, signal INPULSE becomes a function of both signal INCLK and DTAP(1). The high time of signal INPULSE in this case is two VDEL propagation delays (and the duty cycle of signal INPULSE becomes 50% when the VDEL chain is matched to the period of signal INCLK). The coarse and medium delay select vectors are set to their minimum values at the beginning of initialization. This is to ensure that not more than one rising edge can be detected in the delay chain.

The minimum VDEL delay in this case is designed to approximate the delay needed by the period adjustment circuitry in the "worst case speed" corner of the operating window. The worst case speed corner corresponds to maximum frequency, high temperature, low operating voltage and semiconductor parameters corresponding to large gate propagation delay times. In this way, signal INPULSE will have acceptable high and low times even during the early stages of initialization. Acceptable high and low times on signal INPULSE are necessary to avoid speed paths in the clock generator circuitry.

Figure 13:
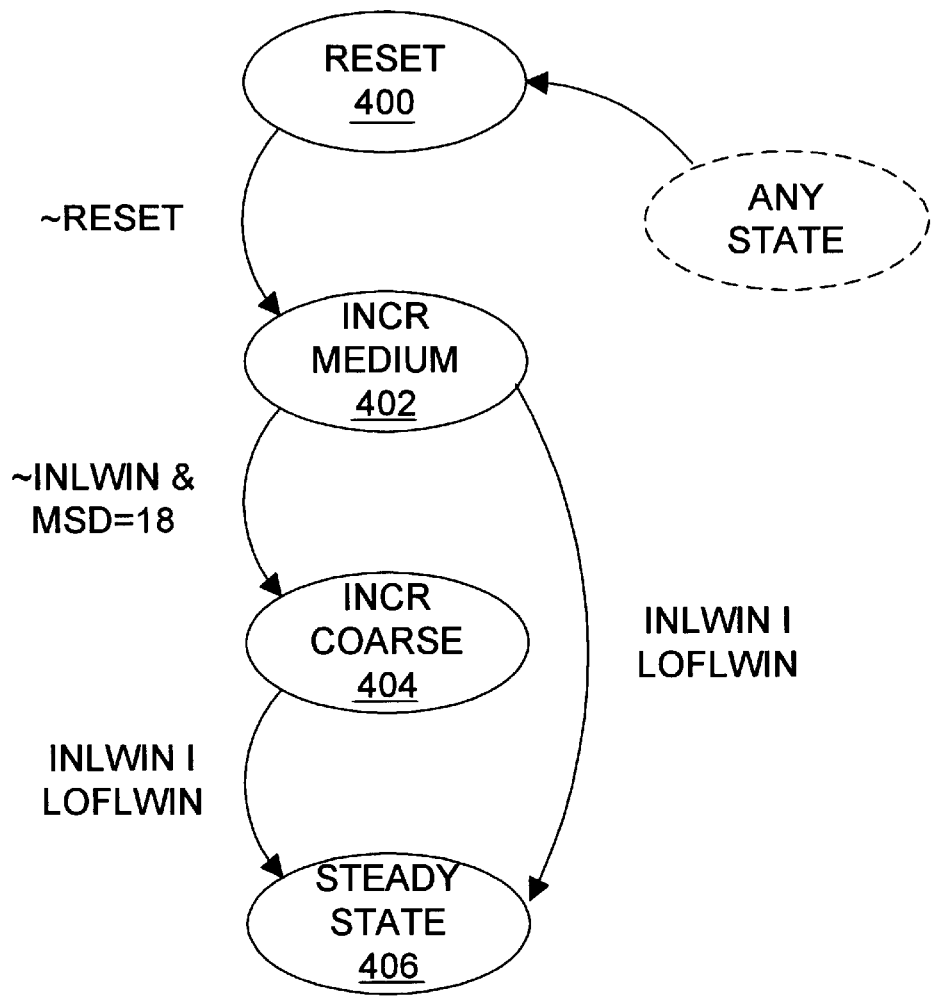
FIG. 13 is a flow chart illustrating the steps of the initialization sequence for the clock waveform generator.
Figure 14:
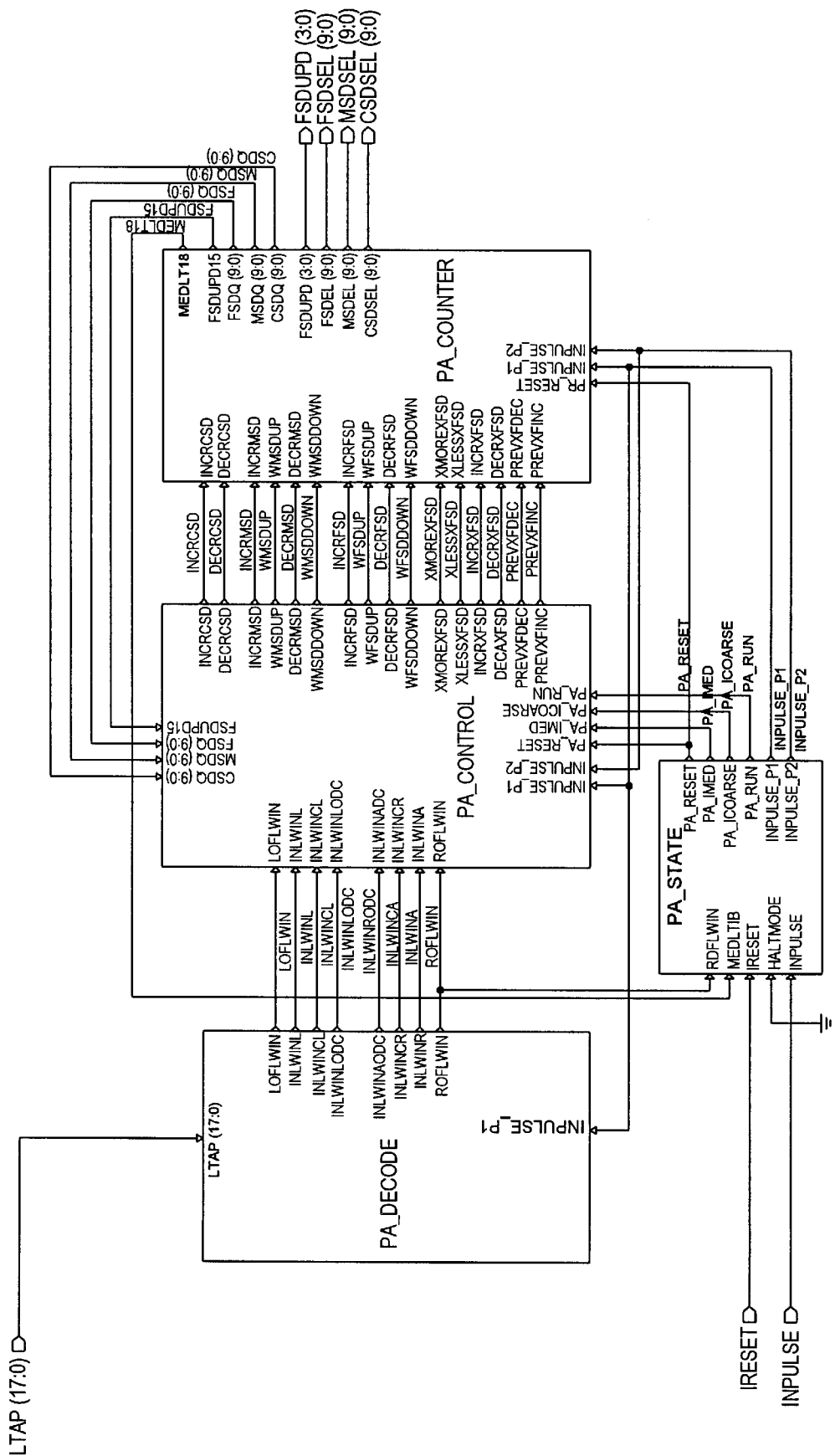
FIGS. 14–27 are a set of schematic diagrams that illustrate a circuit implementation of a control unit.
Figure 15:
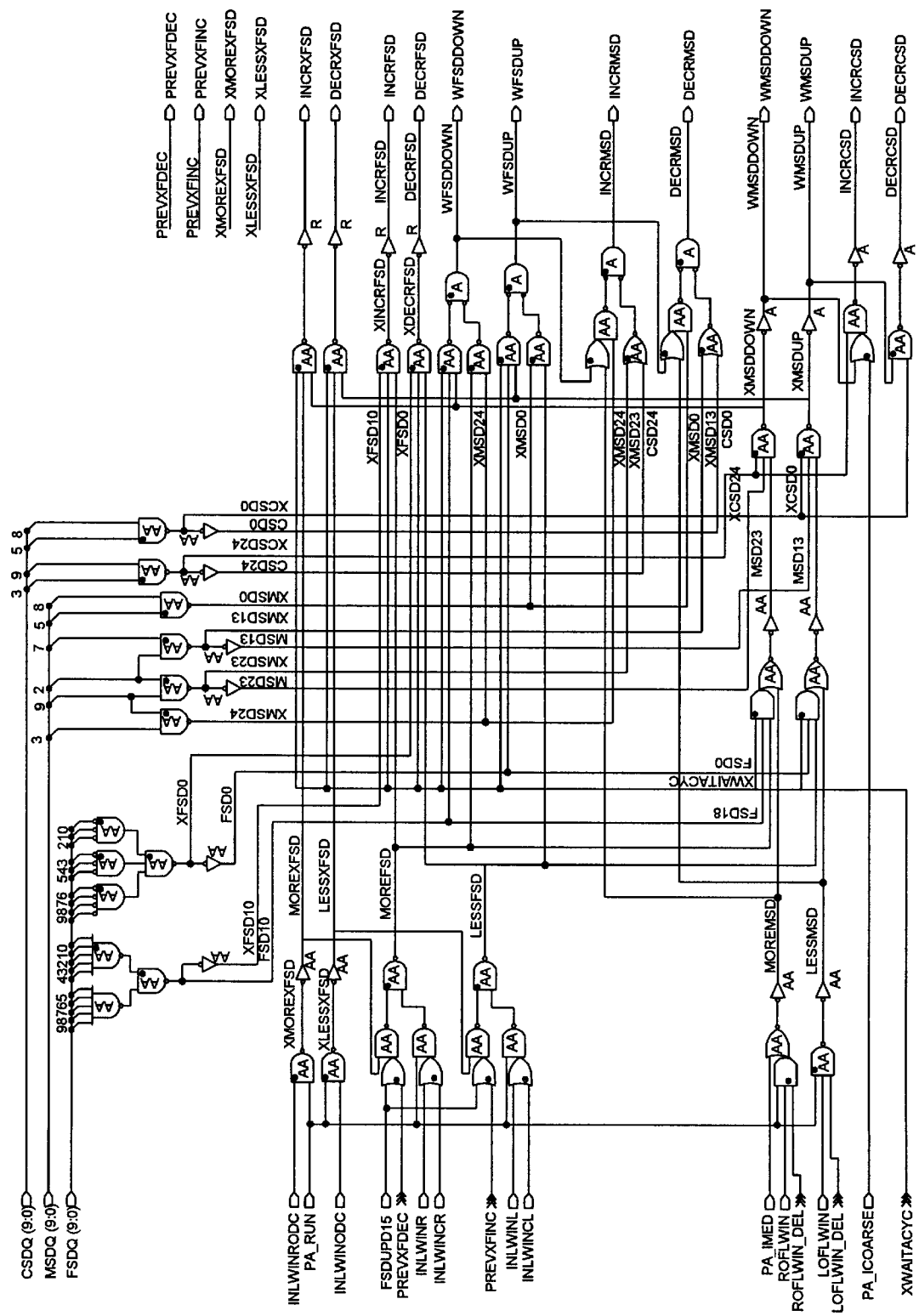
Figure 16:
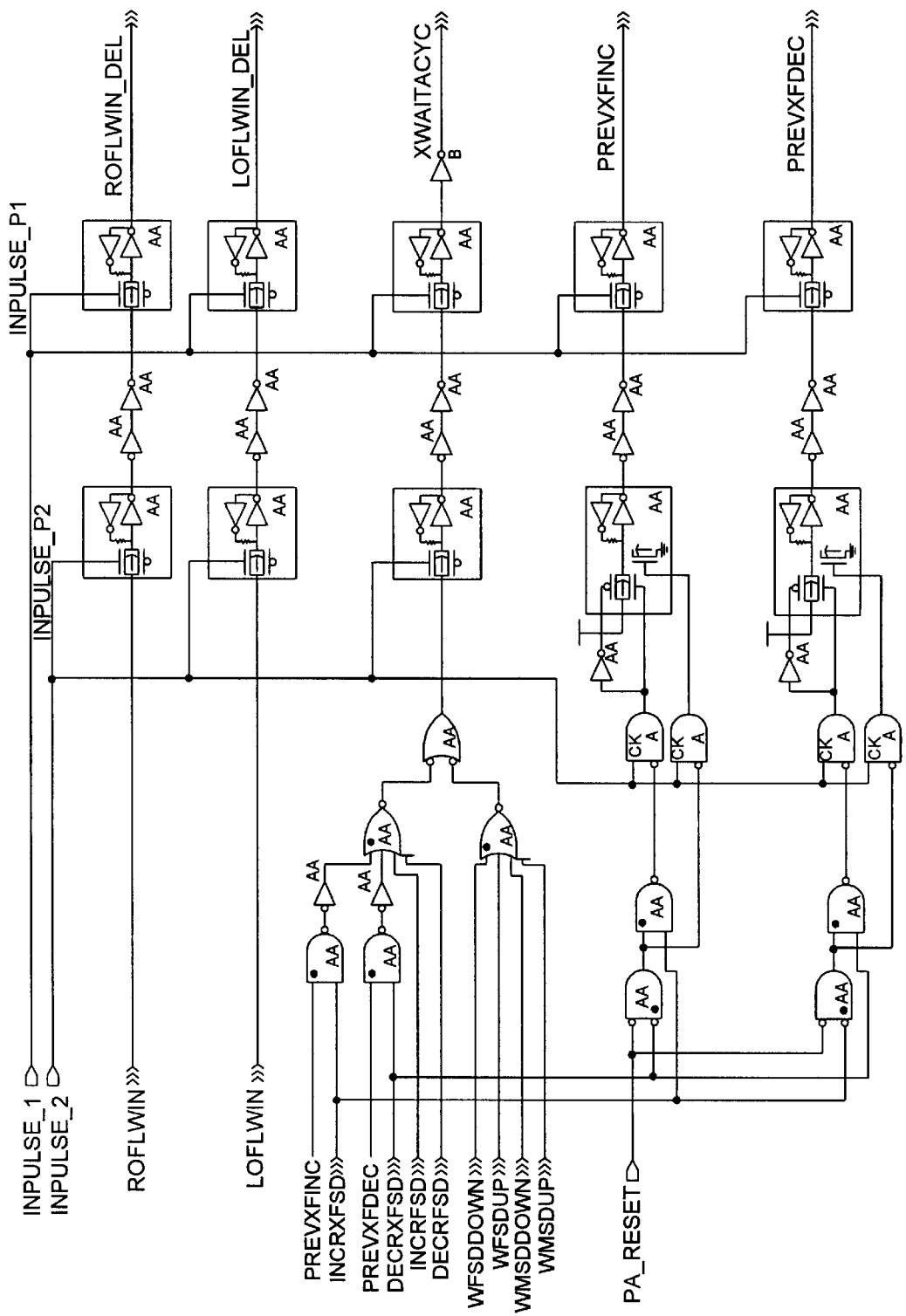
Figure 17:
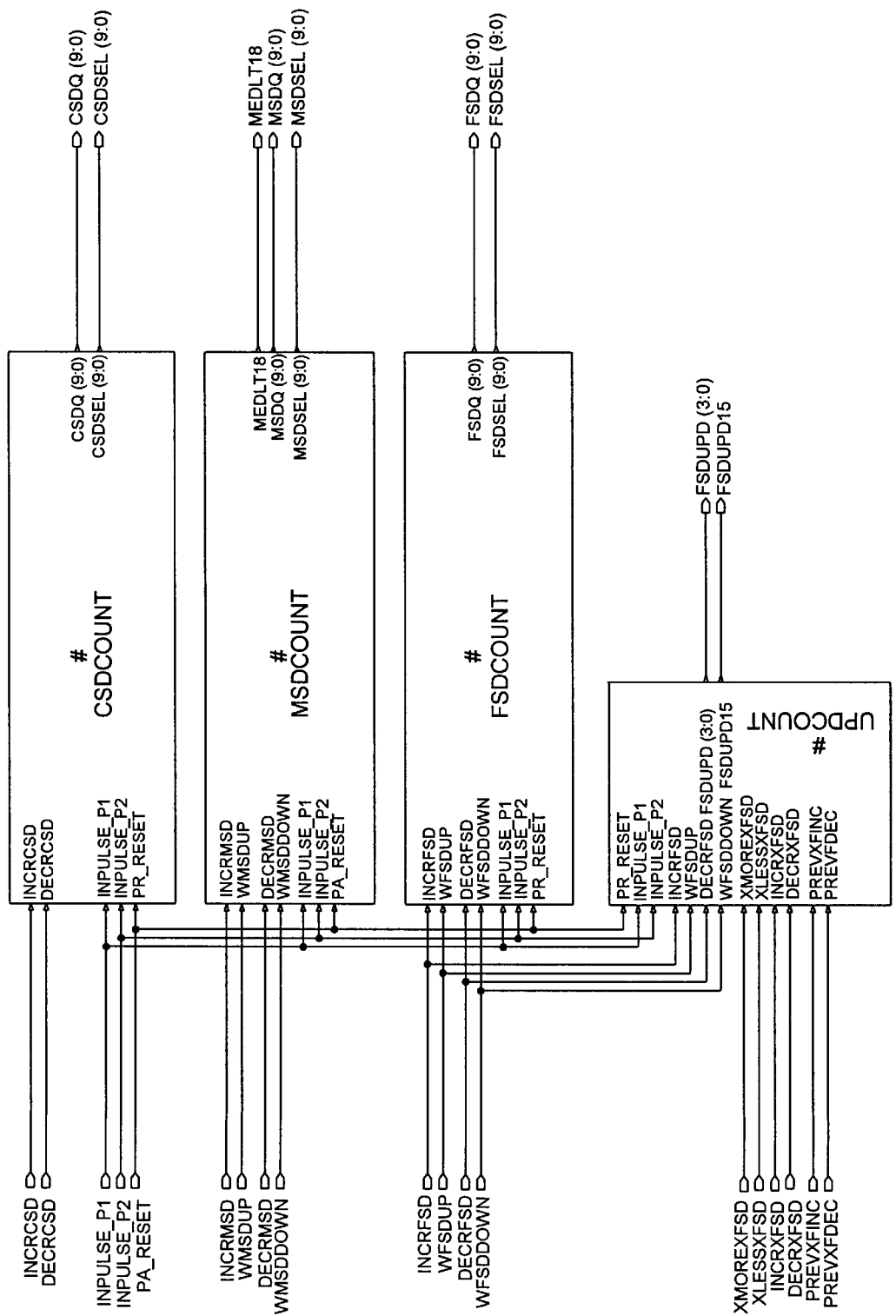
Figure 18:
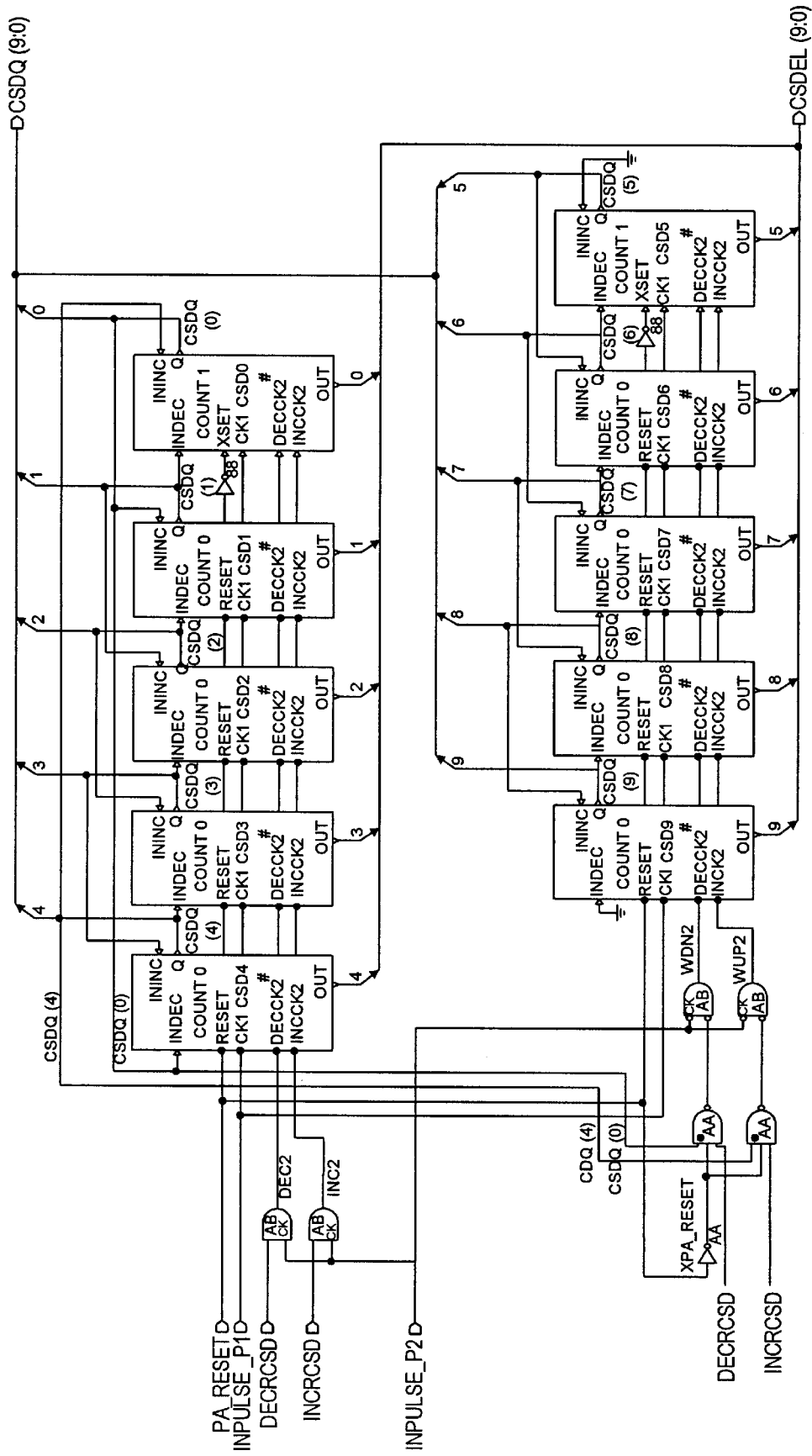
Figure 19:
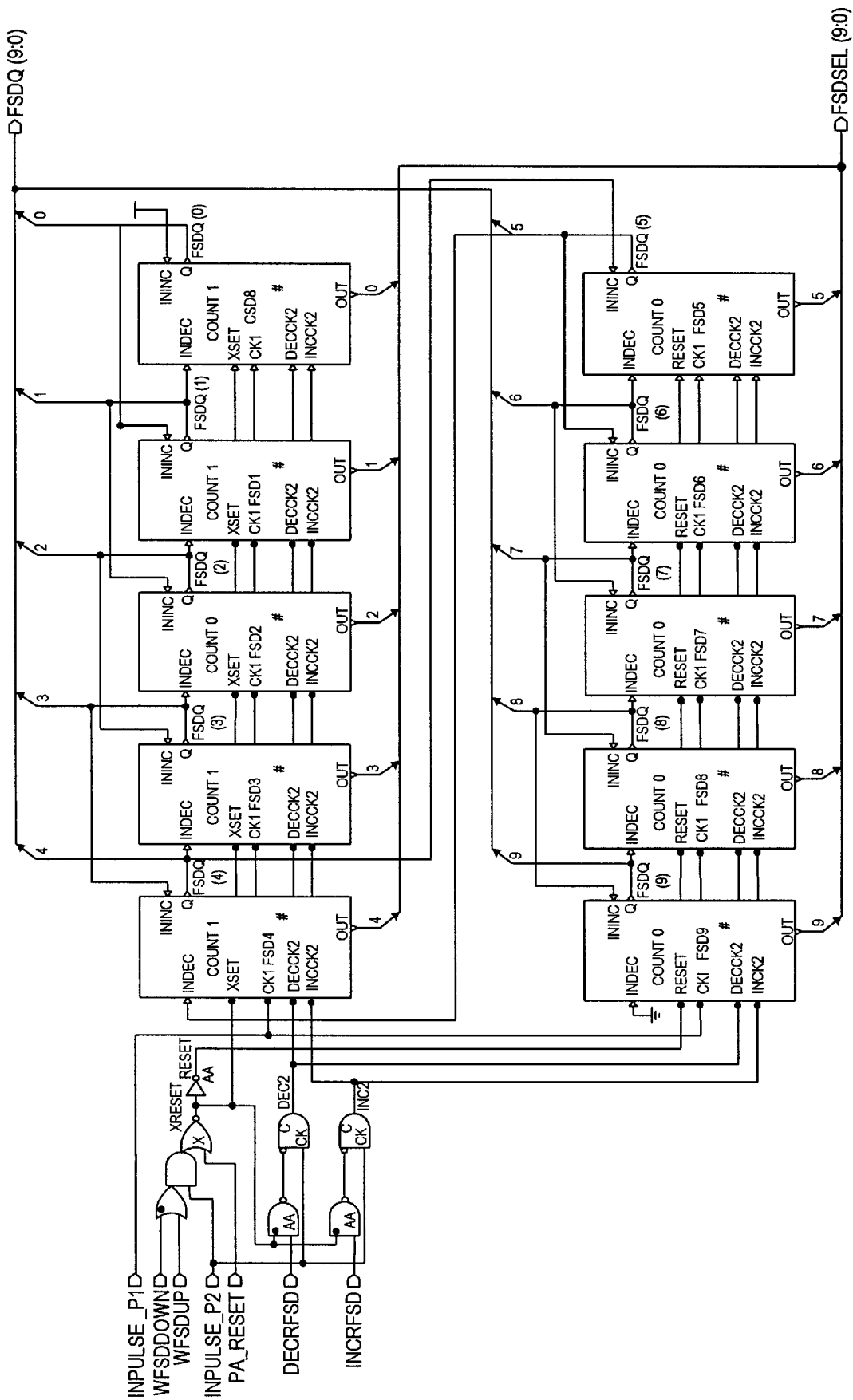
Figure 20:
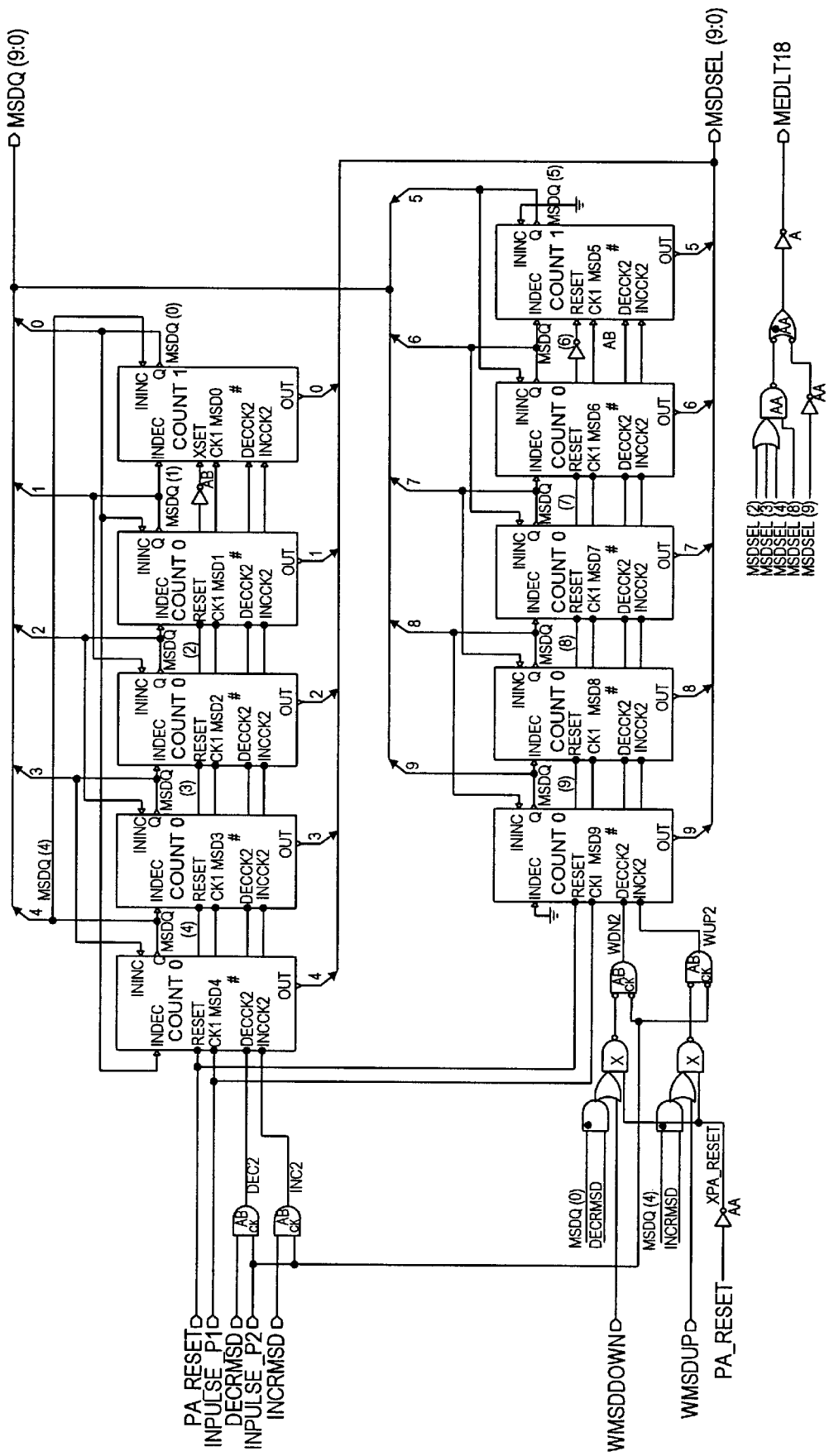
Figure 21:
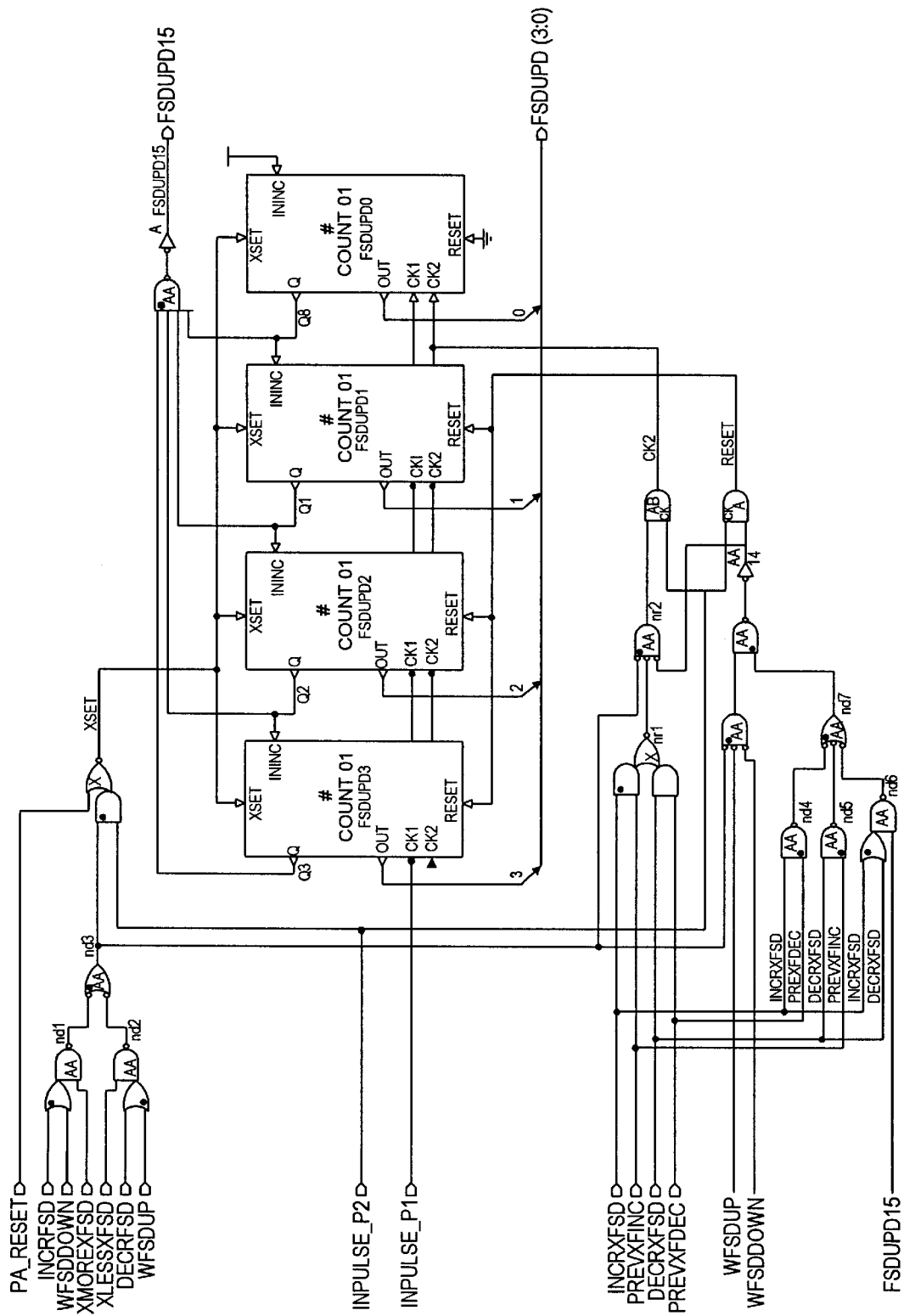
Figure 22:
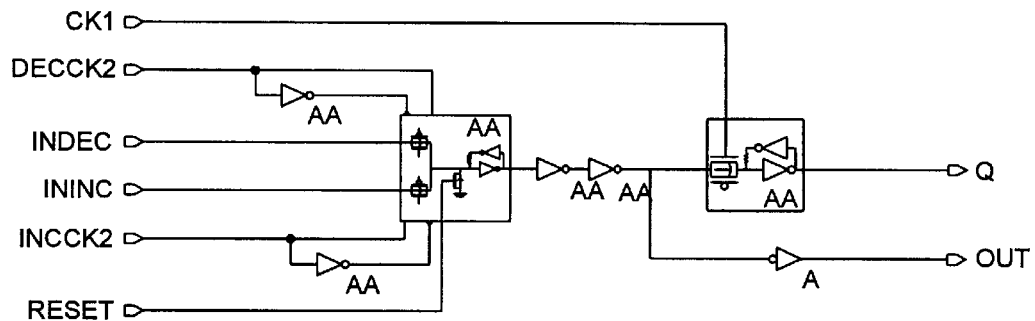
Figure 23:
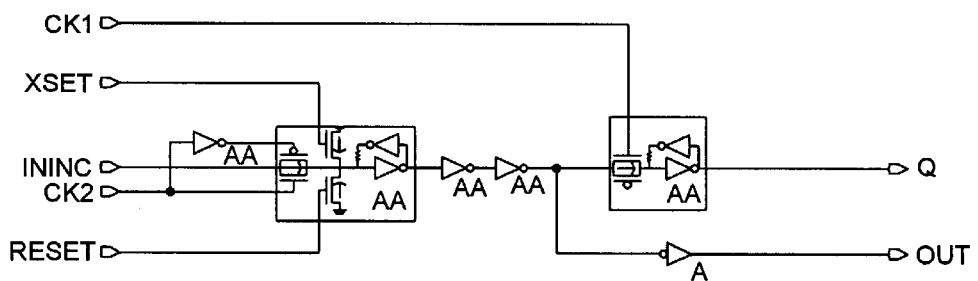
Figure 24:
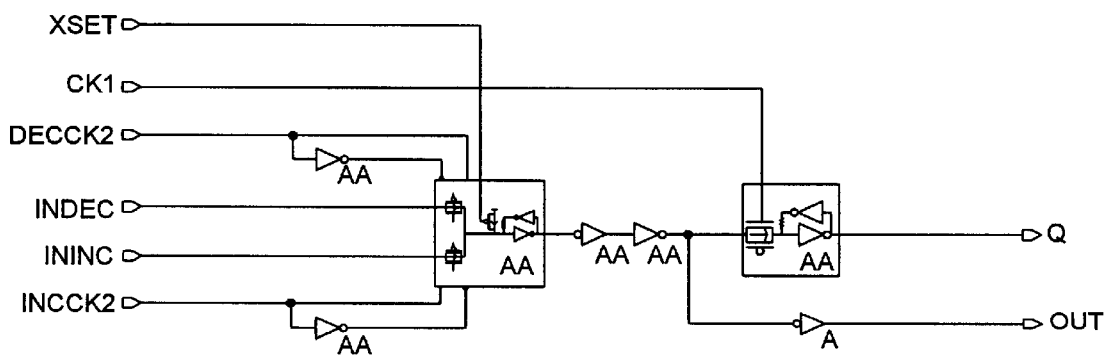
Figure 25:
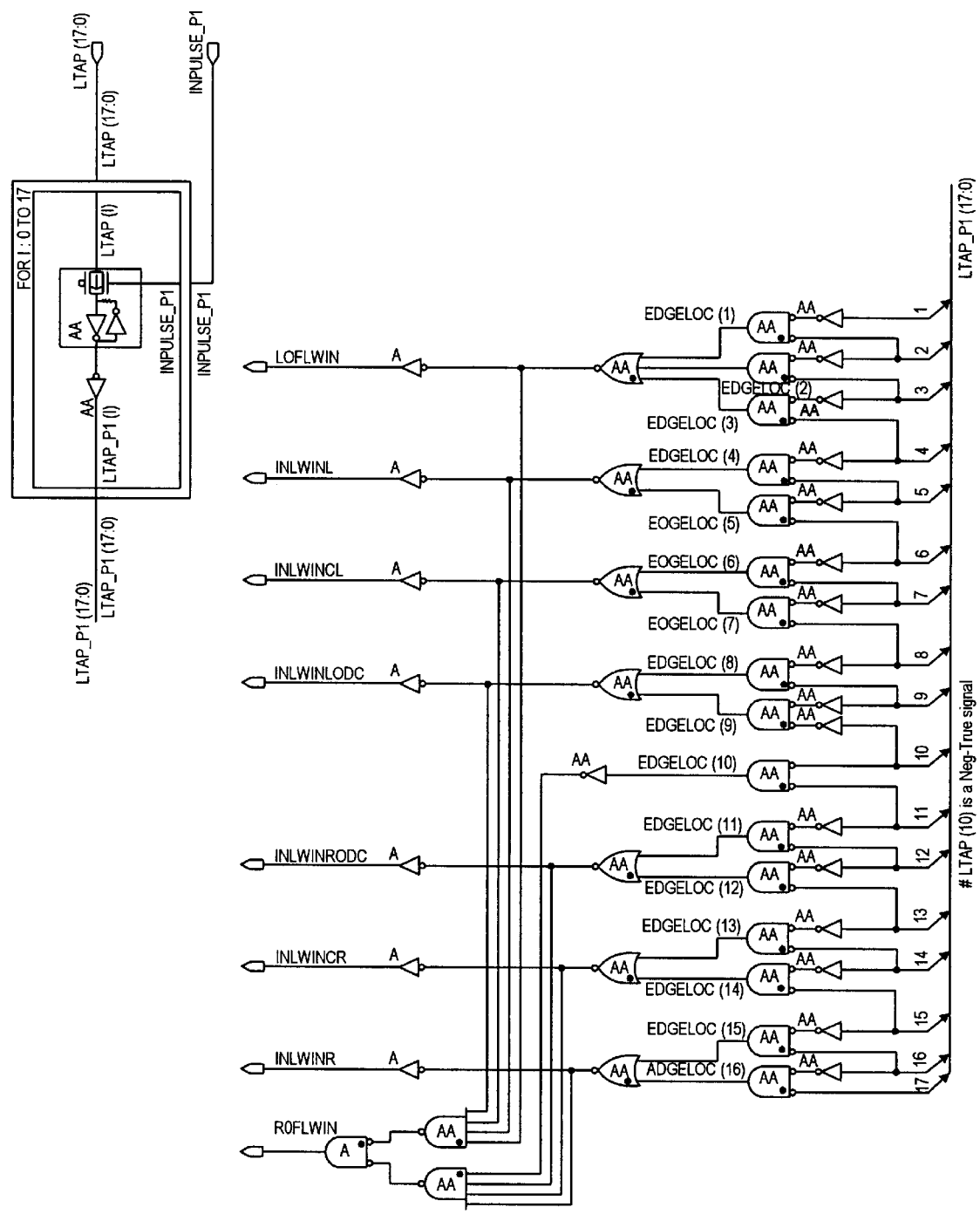
Figure 26:
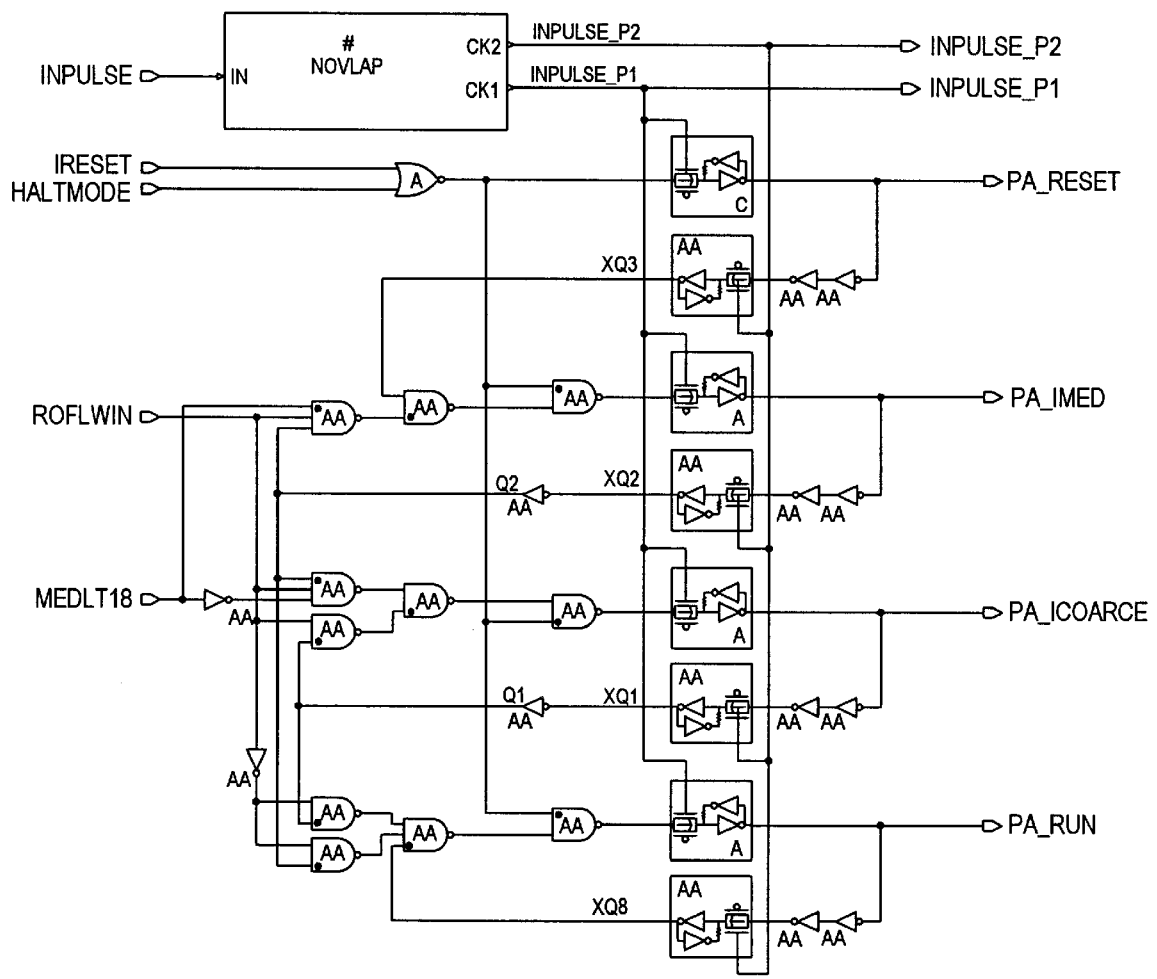
Figure 27:
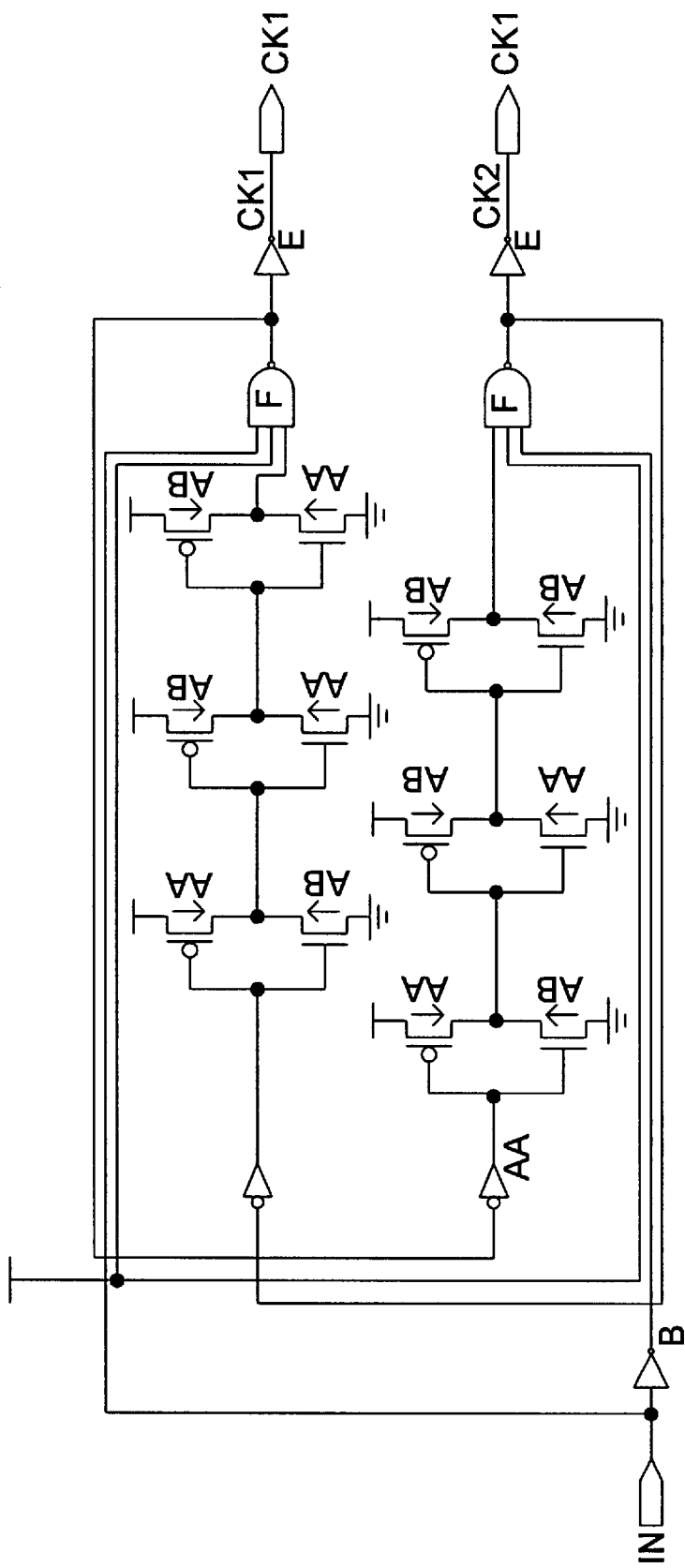

The initialization sequence as shown in FIG. 13 begins when the processor comes out of a reset state 400 or a short time after the processor leaves a power-saving state. The fine step delay vector is initially set to its nominal value of five (out of a range of one to ten).

First the medium step delay is increased during a state 402 until the rising edge is detected in the lock window or to the right of the lock window, or until the medium delay reaches a select value of eighteen, whichever event occurs first. The medium delay is incremented first to minimize jitter in the steady state as discussed earlier. The coarse delay is incremented after a certain minimum amount of medium delay is in the chain. In this way, the coarse delay is never changed close to the "worst case speed" operating/process corner.

If the medium delay select value reaches eighteen before the edge is detected inside or to the right of the lock window, then the coarse delay begins to be incremented during a state 404. This continues until the rising edge is in the lock window, is to the right of it, or until the coarse delay reaches the upper end of its range. At this point, the edge is either in the lock window or very close to it and the steady-state algorithm as described above is implemented to make further adjustments during state 406.

The initialization sequence described above has special applicability in the case of power-saving modes of the processor. The processor can have a power-saving mode in which the input clock frequency can either be slowed greatly or stopped altogether. Many CMOS microprocessors today use static design techniques that result in microamp level supply current drain when activity on the chip stops.

Starting up the clocks on a processor that has been in a power-saving mode for a time will cause the temperature of the microprocessor to change at a relatively high rate for a short time. Additionally, the delay chain length that was specified when the clocks stopped will no longer be correct for matching the input clock period. This is because the temperature has had made a "sudden" change between the time the clocks stopped and the time they were started up again. The temperature change appears sudden since, due to the clocks being stopped, the delay chain has been inactive during the temperature change. This problem is solved by producing clocks that are divided down from the input clock while the delay chain is being initialized, as described above.

The control unit 70 may be embodied in a variety of implementations. For example, in one embodiment, a functional description of the control unit 70 was written in the behavioral language Verilog.

Verilog Listing of an Embodiment of Control Unit 70

```
module  PERADJ      CSDSEL [9:0], FSDSEL [9:0], FSDUPD [3:0], MSDSEL [9:0], WP,
                    RESET, INPULSE, IRESET, LTAP [17:0]);
//============================================================================
// outputs:
output [9:0] CSDSEL;
output [9:0] FSDSEL;
output [9:0] MSDSEL;
output ;
output RESET;
output [3:0] FSDUPD;      // controls which of 4 VDEL units get their
                          // fine step delays updated.
//============================================================================
// inputs:
input INPULSE, IRESET;
input [17:0] LTAP;        // latched delay line taps
```

| Verilog Listing of an Embodiment of Control Unit 70 |
|---|

```
//===========================================================================
// I/O declarations (scalar wire default):
wire [17:0] LTAP;
reg [9:0] CSDSEL;
reg [9:0] FSDSEL;
reg [9:0] MSDSEL;
reg PHADJEN;
reg RESET;
reg [3:0] FSDUPD;
//===========================================================================
// local declarations/definitions:
integer i;
reg HALTMODE;              // temporarily a local reg - an input later
reg moremsd, lessmsd, morefsd, lessfsd, morexfsd, lessxfsd;
reg incrcsd, decrcsd;      // incr/decr coarsed step delay
reg incrmsd, decrmsd;      // incr/decr medium step delay
reg incrfsd, decrfsd;      // incr/decr fine step delay
reg incrxfsd, decrxfsd;        // incr/decr extra-fine step delay
reg wfsddown, wfsdup;      // fsd wrapping back to compensate for movement
                           // of msd
reg wmsddown, wmsdup;      // fsd wrapping back to compensate for movement
                           // of msd
reg [17:0] edgeloc;        // register indicating location of rising edge
                           // "1" => edge has just passed this tap point.
reg loflwin, roflwin;      // rising edge to left or right of window
reg inlwin;                // rising edge is in lock window
reg inlwinc, inlwincl, inlwincr;    // various places in l.win.
reg inlwinlodc, inlwinrodc, inlwindc;     // around dead center of lwin
reg inlwinl, inlwinr;
reg inlwincl_p2, inlwincl_del;      // delayed versions of inlwincl
reg inlwincr_p2, inlwincr_del;      // delayed versions of inlwincr
reg inlwinlodc_p2, inlwinlodc_del;  // delayed versions of inlwinlodc
reg inlwinrodc_p2, inlwinrodc_del;  // delayed versions of inlwinrodc
reg inlwinl_p2, inlwinl_del;        // delayed versions of inlwinl
reg inlwinr_p2, inlwinr_del;        // delayed versions of inlwinr
reg loflwin_p2, loflwin_del;        // delayed versions of loflwin
reg roflwin_p2, roflwin_del;        // delayed versions of roflwin
// period adjust state machine states:
reg pa_reset, pa_imed, pa_icoarse, pa_run;
reg pa_reset_p1, pa_imed_p1, pa_icoarse_p1, pa_run_p1;     // delayed 1 phase
reg [3:0] nextstate;       // temporary register for next state
reg [4:0] csd_count, msd_count, fsd_count;  // delay count registers
reg medlt18;               // medium delay less than 18 (out of 25 max)
reg waitacyc;
reg prevxfdec, prevxfinc;  // previous extra-fine decrement, increment
//===========================================================================
// begin description of module:
// temporary force:
initial HALTMODE = 0;
always @ (posedge INPULSE)
    begin
        #(`EARLY);
        // Note long delay in this block. Don't put other assignments
        // here.
        // reset generation:
        if (IRESET)
            begin
                RESET = 1;   // assert reset to rest of chip
                @ (IRESET)   // wait for deassertion of external reset
                begin
                    # (100 * `CYCLE ) RESET = 0;  // then hold internal reset
                                                  // for 100 more cycles
                end
            end
    end         // reset generation block
always @ (posedge INPULSE)
    begin
        # (`EARLY);
        // half-cycle delays of signals:
        pa_reset_p1 = pa_reset;
        pa_imed_p1 = pa_imed;
        pa_icoarse_p1 = pa_icoarse;
        pa_run_p1 = pa_run;
        inlwinlodc_del = inlwinlodc_p2;
        inlwinrodc_del = inlwinrodc_p2;
        inlwincl_del = inlwincl_p2;
        inlwincr_del = inlwincr_p2;
        inlwinl_del = inlwinl_p2;
```

| Verilog Listing of an Embodiment of Control Unit 70 |
| --- |

```
            inlwinr_del = inlwinr_p2;
            loflwin_del = loflwin_p2;
            roflwin_del = roflwin_p2;
// waitacyc causes the fine (or extra-fine) delay step changes
// to be made not more than once every 2 cycles:
waitacyc = incrxfsd | decrxfsd | incrfsd | decrfsd
                    | wfsddown | wfsdup | wmsdup wmsddown;
                // also wait for a cycle when wrapping the msd because
                // this is probably the result of an attempted xfsd
                // adjustment.
            // prevfinc/dec indicate the direction of the most recent
            // extra-fine step delay adjustment. Note that the extra-fine
            // step adjustment is ignorant of any wrapping that may be
            // necessary as the result of a fine step adjustment.
            if (IRESET | HALTMODE | decrxfsd)
                prevxfinc = 0;
            else if (incrxfsd)
                prevxfinc = 1;
            if (IRESET | HALTMODE | incrxfsd)
                prevxfdec = 0;
            else if (decrxfsd)
                prevxfdec = 1;
    end    // early INPULSE-high begin block
always @ (posedge INPULSE)
    begin
        # (`MIDDLE);
        // look for rising edge in chain & assert edgeloc [i] where found:
        // edgeloc [i] means that the rising edge has reached the i-th
        // delay tap but has not yet reached the next delay tap
        for ( i=1; i<17; i=i+1)
                    edgeloc [i] = LTAP [i] & ~LTAP [i+1];
        // now correct edgeloc [9&10] [10 is neg-true tap in center of lock]
        edgeloc [9] = LTAP [9] & LTAP [10];
        edgeloc [10] = ~LTAP [10] & ~LTAP [11];
                // note that bit 0 of the delay tap bus is not looked
                // at. This is because the current rising edge may have
                // propogated into the beginning of the chain by the
                // time the previous edge (currently being sampled) is
                // latched by the delayed version on INPULSE. This
                // delay on INPULSE is necessary to account (exactly)
                // for the delay of the lock window.
                // It would be a bit safer in this regard to not look at
                // bit 1 of the delay tap bus either, to give the
                // current rising edge more headroom. This is not done,
                // however, so as to make the circuit more robust in the
                // case of a rapidly increasing delay chain length
                // (increasing due to environmental conditions).
                // Note also that edgeloc [17] is not assigned (would
                // need a LTAP [18] to do so). If none of edgeloc [2:16]
                // are asserted, then edge is to right of the lock window.
        // some decoding of the "edge location" signals:
        loflwin = | edgeloc [3:1];      // to left of (before) lock window
                                        // (too much delay in chain)
        inlwin = | edgeloc [16:4];      // in lock window
        inlwinl = | edgeloc [5:4];      // in left (early) end of lock window
        inlwinc = | edgeloc [14:6];     // in center part of lock window
        inlwincl = | edgeloc [7:6];     // in left end of center of window
        inlwinlodc = edgeloc [9:8];         // just left of dead center
        inlwindc = | edgeloc [10];      // in dead center of window
        inlwinrodc = | edgeloc [12:11];     // just right of dead center
        inlwincr = | edgeloc [14:13];   // in right end of center of window
        inlwinr = | edgeloc [16:15];    // in right (late) end of lock window
        roflwin = ! (| edgeloc [16:1] );    // to right of (after) lock window.
                                            // (not enough delay in chain)
    end    // middle INPULSE-high begin block
always @ (negedge INPULSE)
    begin
        # (`EARLY);
        // half-cycle delays of signals:
        inlwinlodc_p2 = inlwinlodc;
        inlwinrodc_p2 = inlwinrodc;
        inlwincl_p2 = inlwincl;
        inlwincr_p2 = inlwincr;
        inlwinl_p2 = inlwinl;
        inlwinr_p2 = inlwinr;
        loflwin_p2 = loflwin;
        roflwin_p2 = roflwin;
    // The "period-adjust state machine" is used only for
```

| Verilog Listing of an Embodiment of Control Unit 70 |
| --- |

```
        // initialization of the period-adjust circuitry during reset or
        // coming out of a haltmode situation (when the clocks have
        // possibly been stopped for some time, causing the temperature to
        // change with apparent abruptness).
        // period-adjust state machine evaluation:
        case ({pa_reset_p1, pa_imed_p1, pa_icoarse_p1, pa_run_p1})
            `b1000:    // reset state; wait for external reset to go away
                    begin
                            if (IRESET | HALTMODE)
                                    nextstate = `b1000;
                            else
                                    nextstate = `b0100;
                    end
            `b0100:    // imed state - incr msd until in window or until
                    // medium delay is 18, whichever is first
                    begin
                            if (IRESET | HALTMODE)
                                    nextstate = `b1000;
                            else if (roflwin & medlt18)
                                    nextstate = `b0100;        // increment medium
                                                               // delay some more
                            else if (roflwin & !medlt18)
                                    nextstate = `b0010;        // now increment coarse
                                                               // delay
                            else if (!roflwin)
                                    nextstate = `b0001;        // in lock window
                                                               // (or before)
                            else
                                    nextstate = `bx;
                    end
            `b0010:    // icoarse state - incr csd until in lock window
                    begin
                            if (IRESET | HALTMODE)
                                    nextstate = `b1000;
                            else if (roflwin)
                                    nextstate = `b0010;        // stay here & incr more
                            else if (!roflwin)
                                    nextstate = `b0001;        // in lock window
                                                               // (or before)
                            else
                                    nextstate = `bx;
                    end
            `b0001:    // run state - completed initialization
                    begin
                            if (IRESET | HALTMODE)
                                    nextstate = `b1000;
                            else
                                    nextstate = `b0001;
                    end
            default: nextstate = `bx;
        endcase
        {pa_reset, pa_imed, pa_icoarse, pa_run} = nextstate;
        // jam reset state:
        if (IRESET | HALTMODE)
                {pa_reset, pa_imed, pa_icoarse, pa_run} = `b1000;
        end     // early INPULSE low thingies
always @ (negedge INPULSE)
        begin
            # (`EARLY+2);
            // control for the delay step counters:
            // note that last cycle's count values are used here:
            // extra-fine step delay (xfsd) adjustment is really just
            // enabling the current fine step delay selection to 1/2/3/4
            // vdel units.
        // Note that if last cycle all vdel units saw the
                // (then current) fsd, and a xfsd is needed this cycle, then
                // this cycle only the first unit will see the new,
                // incremented fsd (this "wrapping" can be seen where FSDUPD
                // is assigned).
                morexfsd = pa_run & inlwinrodc;
                lessxfsd = pa_run & inlwinlodc;
                // more/less fine step needed (but not necessarily taken):
                morefsd = pa_run & (inlwinr | inlwincr)
                            | morexfsd & (prevxfdec | FSDUPD==15);
                lessfsd = pa_run & (inlwinl | inlwincl)
                            | lessxfsd & (prevxfinc | FSDUPD==15);
                        // note that (in addition to other cases) a change in
                        // the fsd is desired (but not necessarily made) when
```

| Verilog Listing of an Embodiment of Control Unit 70 |
|---|

```
            // a change in direction of the xfsd movement is seen
            // or when the fsdupd is maxed out.
                    // note also that if the pa__run state output becomes
                    // a speed path in this phase that we could use a
                    // 1-phase delay of it (and any other s.m. outputs)
        // wrap msd down because csd needs to be incremented (an fsd
        // increment requires an fsd wrap and therefore an msd
        // increment, or just an MSD increment alone is needed, but
        // the msd is getting close to its upper limit and so the msd
        // itself needs to be wrapped and the csd incremented):
        wmsddown = (!waitacyc & morefsd
                    & (fsd_count==10) | moremsd)
                    & (msd_count==23) & (csd_count!==24);
        // wrap msd up because csd needs to be (and can be)
        // decremented:
        wmsdup = (!waitacyc & lessfsd
                    & (fsd_count==0) | lessmsd)
                    & (msd_count==13) & (csd_count!==0);
                    // note that we don't allow the csd to fall below 13
                    // before decrementing the csd. This is so that we
                    // make a csd adjustment only some distance from the
                    // slow Si / high frequency corner (13 msd steps from
                    // that corner). This reduces jitter in that corner
                    // where it both matters most and is greatest.
        // increment/decrement extra-fine step delay:
        incrxfsd = !waitacyc & morexfsd & !wmsddown;
        decrxfsd = !waitacyc & lessxfsd & !wmsdup;
                    // An extra-fine step adjustment is made by changing the
                    // fine step delay seen by one vdel unit at a time. This
                    // may or may not involve a decrement/increment of the
                    // fine step delay (source) itself. The extra-fine step
                    // adjustment is made with the FSDSEL and FSDUPD signals
                    // acting in concert.
                    //
                    // Note that an extra-fine step is not taken if we are
                    // currently wrapping the msd. This is to minimize
                    // jitter; when an msd wrap is performed, the fsd wrap
                    // and FSDUPD change do not occur.
        // increment/decrement fine step delay:
        incrfsd = !waitacyc & (fsd_count!==10) & morefsd;
        decrfsd = !waitacyc & (fsd_count!==0) & lessfsd;
                    // Note that these do not assert in the case of wrapping.
                    // They may assert at the same time as incrxfsd/decrxfsd,
                    // however.
        // wfsddown (wrap fsd down) indicates that the fine-step delay
        // has been incremented to its limit and an increment in the
        // medium step delay is needed (and possible) and that the fsd
        // should be decremented ("wrapped") to compensate:
        wfsddown = !waitacyc & !wmsddown & (fsd_count==10)
                    & morefsd & (msd_count!==24);
        // wfsdup (wrap fsd up) - like wfsddown but in the other dir.
        wfsdup = !waitacyc & !wmsdup & (fsd_count==0)
                    & lessfsd & (msd_count!==0);
                    // Note that the fsd is not wrapped at the same time
                    // that an msd wrap is occurring. The msd wrap goes
                    // first, and then the fsd wrap can occur (if still
                    // needed).
        // more/less msd does not encompass the movement of msd for
        // the case of fsd wrapping. It is only a relatively rapid
        // adjustment in cases where the rising edge is outside the
        // lock window:
        moremsd = (pa_imed | pa_run & roflwin & roflwin_del);
        lessmsd = pa_run & loflwin & loflwin_del;
                    // note that if the rising edge goes outside of the
                    // lock window for 2 cycles that a medium, not a fine
                    // step delay adjustment is made.
        // increment/decrement medium step delay:
        incrmsd = (moremsd | wfsddown) & (msd_count!==24)
                    & ((msd_count!==23) | (csd_count==24));
        decrmsd = (lessmsd | wfsdup) & (msd_count!==0)
                    & ((msd_count!==13) | (csd_count==0));
        // increment/decrement coarse step delay:
        incrcsd = (csd_count!==24) & (pa_icoarse | wmsddown);
        decrcsd = (csd_count!==0) & wmsdup;
    end   // early+2 INPULSE low stuff
    always @ (negedge INPULSE)
      begin
        # (`MIDDLE);
```

| Verilog Listing of an Embodiment of Control Unit 70 |
|---|

```
        // update delay control counters (0:24 are valid count values)
        if (incrcsd)
            csd_count = csd_count + 1;
        if (decrcsd)
            csd_count = csd_count - 1;
        if (incrmsd)
            msd_count = msd_count + 1;
        if (wmsdup)
            msd_count = msd_count + 5;      // increment by 5 to
                                            // compensate for a csd
                                            // *decrement*
        if (decrmsd)
            msd_count = msd_count - 1;
        if (wmsddown)
            msd_count = msd_count - 5;      // decrement by 5 to
                                            // compensate for a csd
                                            // *increment*
        if (incrfsd)
            fsd_count = fsd_count + 1;
        if (decrfsd)
            fsd_count = fsd_count - 1;
        if (wfsdup | wfsddown)
            fsd_count = 5;     // wrapping up or down have the same
                               // effect: center the fine step delay
        if (IRESET | HALTMODE
            | (incrfsd | wfsddown) & !morexfsd
            | (decrfsd | wfsdup) & !lessxfsd)
            FSDUPD = `b1111;
                // note that when the fsd is being adjusted because the
                // edge has moved too far from the center of the window
                // the fsd update signals cause all 4 of the vdel units
                // to see the new delay.
        else if ( !wfsddown & !wfsdup
                    & ((FSDUPD==`b1111) & (incrxfsd | decrxfsd)
                        | incrxfsd & prevxfdec
                        | decrxfsd & prevxfinc))
                FSDUPD = `b0001;
            // if fsd wrapping is occurring in this case then fsdupd
            // is 1111 (the fsd wrap is due to a more/lessxfsd) and
            // needs to stay there.
        else if ( (FSDUPD==`b0001) & (incrxfsd & prevxfinc
                        | decrxfsd & prevxfdec))
                FSDUPD = `b0011;
        else if ( (FSDUPD==`b0011) & (incrxfsd & prevxfinc
                        | decrxfsd & prevxfdec))
                FSDUPD = `b0111;
        else if ( (FSDUPD==`b0111) & (incrxfsd & prevxfinc
                        | decrxfsd & prevxfdec))
                FSDUPD = `b1111;
        if (IRESET | HALTMODE)      // note that reset takes precedence
            begin
                        csd_count=0;    // no coarse step delay initially
                        msd_count=0;    // no medium step delay
                        fsd_count=5;    // center this vernier
            end
        // some decoding of the count values:
        medlt18 = (msd_count<18);
        // now convert delay count into delay select:
        // the coarse and medium delays are selected in 2 stages:
        CSDSEL [9:5] = 1 << csd_count / 5;
        MSDSEL [9:5] = 1 << msd_count / 5;
        CSDSEL [4:0] = 1 << csd_count % 5;
        MSDSEL [4:0] = 1 << msd_count % 5;
        // the fine delay select is cumulative: there are fsd_count
        // bits of FSDSEL set. Each additional bit set in FSDSEL
        // results in more delay.
        FSDSEL = 0;
        for (i=0; i < fsd_count; i=i+1)
            FSDSEL [i] = 1;
    end         // middle INPULSE-low
endmodule
/*******************************************************************
*
    Global definitions
*******************************************************************
/
// clock definition
`define CYCLE 1000                          // cycle time
```

-continued

Verilog Listing of an Embodiment of Control Unit 70

| `define GAP 1 | // gap between phases |
| `define EARLY 40 | // assert early signals |
| `define MIDDLE 80 | // assert middle signals |
| `define LATE 130 | // assert late signals |
| `define V_LATE 150 | // assert very late signals |

The Verilog description may be reduced to a gate level circuit implementation using computer aided design programs or by traditional manual methods. In one embodiment, the Verilog listing disclosed below was reduced to a circuit level implementation as shown in the schematic diagrams of FIGS. 14–27. The control unit of FIGS. 14–27 operates in accordance with the description provided earlier.

Figure 28:
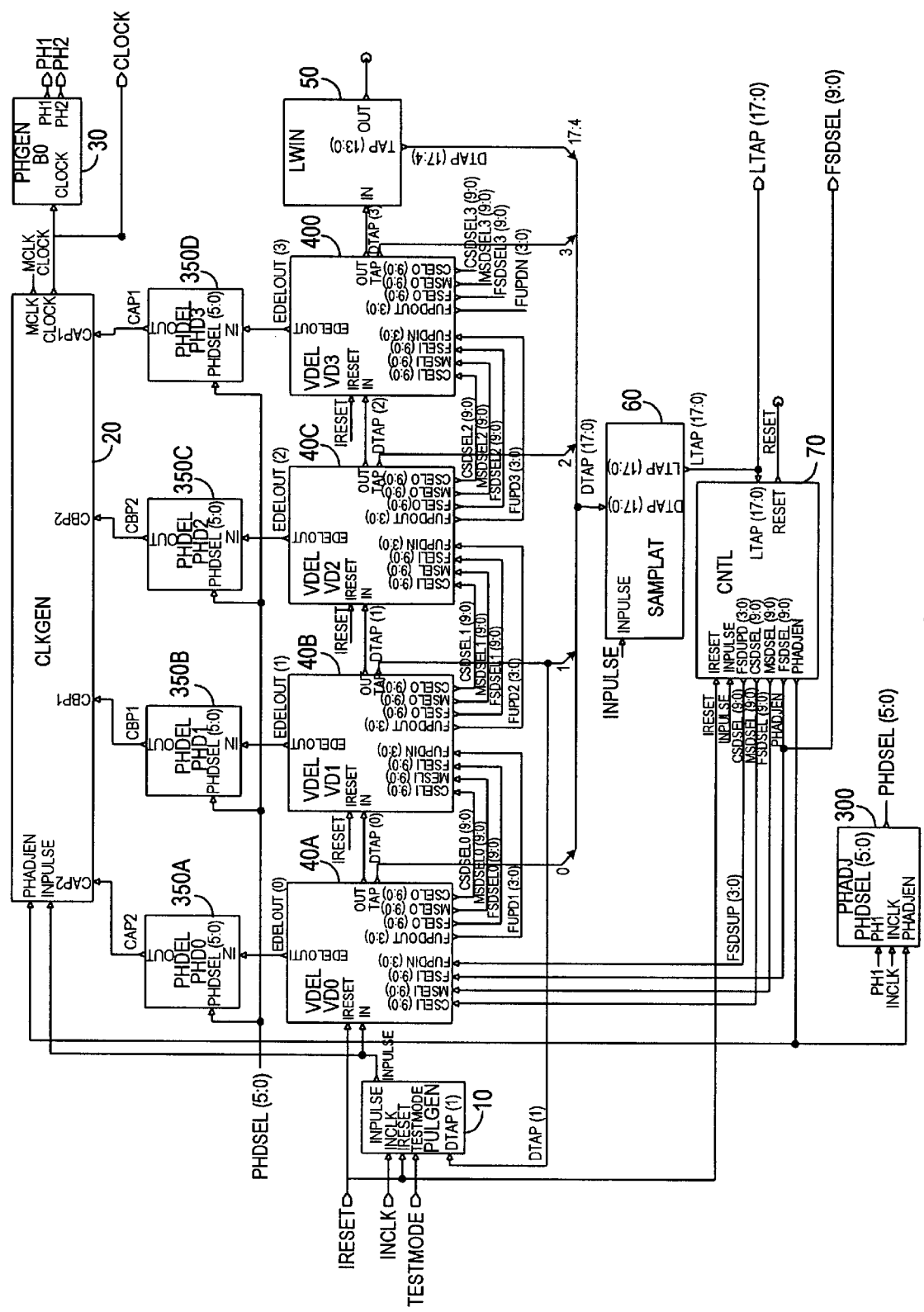
FIG. 28 is a block diagram of a second embodiment of a clock signal waveform generator that generates internal microprocessor clock signals and a phase-aligned system clock signal.
Figure 29:
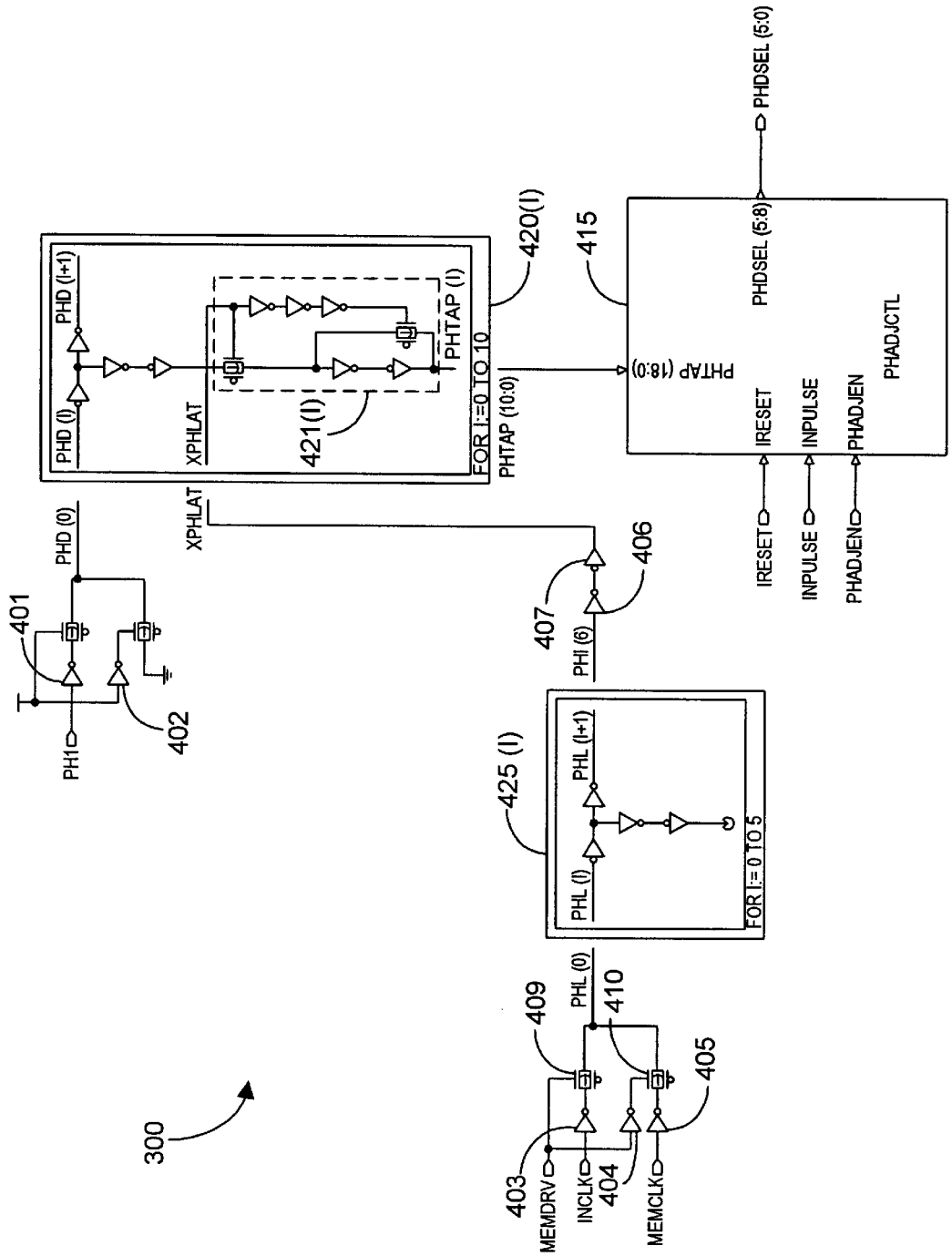
FIG. 29 is a schematic diagram of a phase adjust circuit.
Figure 30:
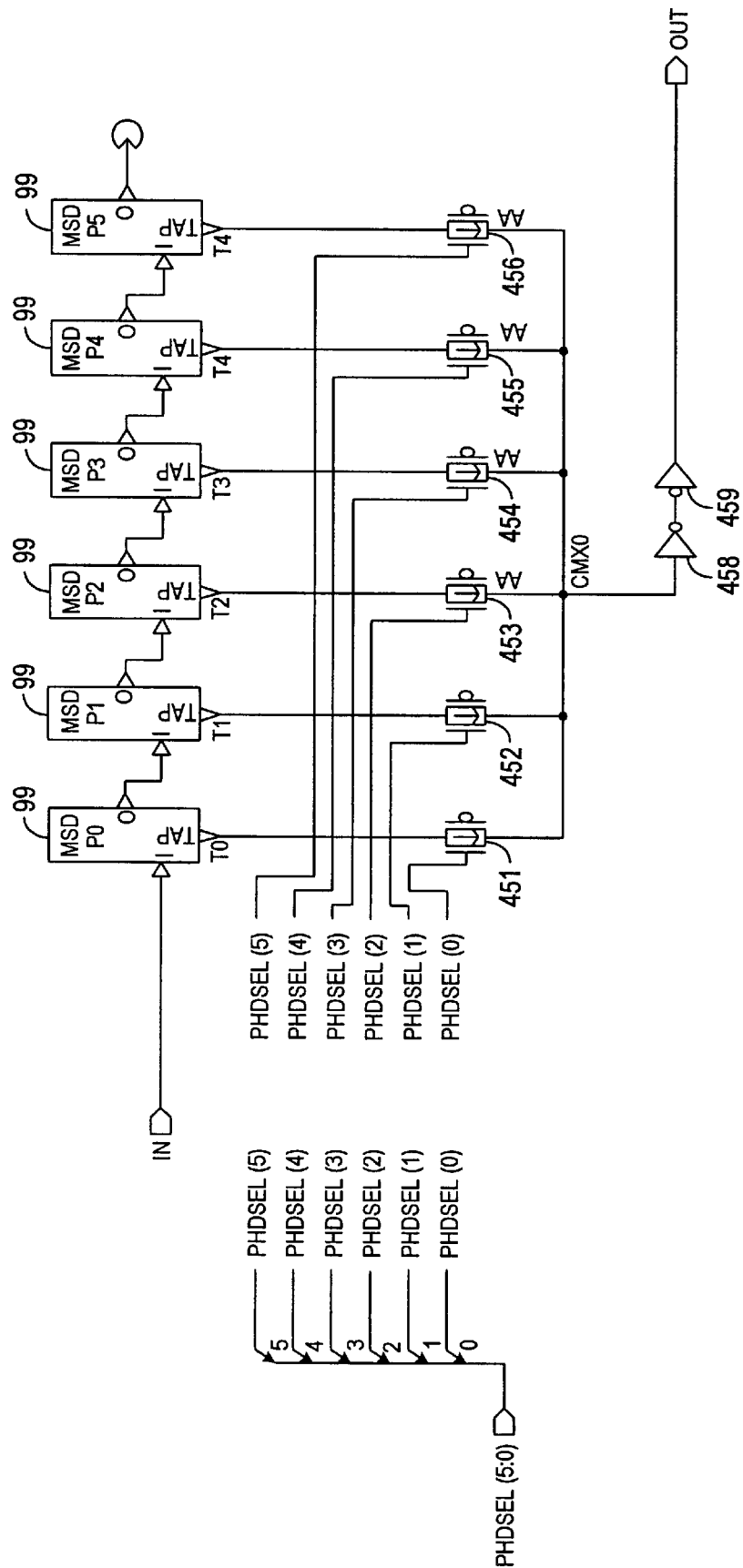
FIG. 30 is a schematic diagram of a phase delay circuit.

Referring next to FIGS. 28–30, a second embodiment of a digital clock waveform generator is shown that includes circuitry for precisely controlling the phase relationship among the various processor clocks and the system clock, even in cases where one processor generates the system clock and another processor receives the system clock as an input. The block diagram of FIG. 28 is similar to that of FIG. 1, and corresponding elements thereof are numbered identically. The block diagram of FIG. 28 additionally includes a phase adjust unit 300 (PHADJ) and a plurality of phase delay units 350A–350D. Each phase delay unit 350A–350D is coupled between a corresponding VDEL unit 40A–40D and the clock synthesis unit 20. A signal MCLK is provided from the clock synthesis unit 20 and is a source of the system clock when the local processor is driving the system clock. The system clock, derived from signal MCLK, can either be the same frequency or half the frequency of signal INCLK. Thus, in this embodiment, the internal clock signals PH1 and PH2 can be up to four times the frequency of the system clock MCLK.

Clock-to-output delays and input setup and hold times in a microprocessor are, among other things, dependent upon the phase relationship between the internal processor clock and the external system clock. The problem is exacerbated in systems in which one processor drives the system clock and another processor takes that clock as an input and in systems in which a single processor takes the system clock as an input.

In a processor that is generating the system clock, the internal processor clocks are synchronized to (brought into phase with) the input clock (labeled INCLK in this embodiment). Since there is inevitable delay incurred in buffering the processor clocks and distributing them across the processor chip, signal INCLK is synchronized with the internal processor clock that is being distributed across the chip. In this embodiment, this clock is PH1. If instead MEMCLK (the system clock) is an input to the processor, then MEMCLK is synchronized to signal PH1.

In a system that contains one processor driving signal MEMCLK and at least one processor that receives signal MEMCLK as an input, signal INCLK, MEMCLK and PH1 are all in phase. In the processor that drives signal MEMCLK, signal PH1 is synchronized to signal INCLK. The PH1/PH2 and MEMCLK drive circuits are designed such that signals MEMCLK and PH1 are delayed the same amount from signal INCLK. Thus, signal MEMCLK is also synchronized with signal INCLK. In the processor that receives signal MEMCLK as an input, signal MEMCLK is used as the phase reference clock to which signal PH1 is synchronized. Since signal MEMCLK is synchronized to signal INCLK already (by the processor driving signal MEMCLK), signals INCLK, MEMCLK and PH1 are all synchronized in the second processor as well.

The phase alignment between the processor clock and a "phase reference" clock is performed in the following manner. A variable delay is added to each of the timing reference signals EDELOUT(3:0) by the PHDEL units 350A–350D. The PHDEL units, being identical in construction, add this delay equally to each of the four signals. The phase adjust unit 300 examines the phase relationship between signal PH1 and the phase reference clock. The reference clock in this embodiment can be either INCLK or the system clock. This, as will be seen later, allows the processor clocks in a multi-processor system to be all synchronized to a single system clock, even if one of the processors is generating the system clock. The phase delay is increased or decreased by the phase adjust unit 300 until the distributed processor clocks (PH1/PH2 in this embodiment) are in phase with the phase reference clock.

FIG. 29 is a schematic diagram of the phase adjust unit 300. The circuit includes inverters 401–405, transfer gates 407–410 and a phase adjust control unit 415. The circuit further includes a delay chain formed of eleven delay units 420(I) (where I=0, 1, . . . 10) and a delay chain consisting of six delay elements 425(I) (where I=0, 1, . . . 5). It is noted that each delay unit 420(I) includes a latch circuit 421(I).

The method for performing the phase synchronization between signal PH1 and the reference clock is similar to that used to synchronize the period of signal INCLK to the VDEL delay chain period. As shown in FIG. 29, the PH1 waveform is sent down the delay chain consisting of the eleven delay units 420(I). The taps from this delay chain are latched by the corresponding latch circuits 421(I) to provide an output vector designated PHTAP(10:0). The signal used to latch the delay chain taps is labeled XPHLAT and is a delayed version of either signal INCLK or MEMCLK, whichever is the selected phase reference signal. The delay used to generate signal XPHLAT is the same as the delay from the beginning of the PH1 delay chain to the center of that chain. That is, the delay formed by the delay elements 425(I) is equal to the delay of the first six delay units 420(I). Thus, if a rising edge is located halfway down the latched delay tap vector PHTAP(10:0), then signal PH1 and the reference clock are in phase.

The phase adjust control unit 415 examines the latched delay tap vector and adjusts the phase delay select bus PHDSEL. An approach and algorithm similar to that used in matching the VDEL chain length to the INCLK period (as described above) may be used to adjust the delay that regulates the phase relationship of the clocks, except that the PHDEL delay chain hardware and the phase delay adjustment algorithm will typically be less complicated.

A schematic diagram representative of each of the phase delay units 350A–350D is shown in FIG. 30. The phase delay unit of FIG. 30 includes six medium delay units 99, six corresponding transfer gates 451–456, and inverters 458 and 459. It is evident that the length of this delay chain can be varied from 1 to 6 MSD unit delays long. If finer adjustment of the phase relationship between the clocks is needed, a fine adjustment capability could be added to this unit similar to that in the VDEL units 40A–40D.

Referring back to FIG. 28, the PHDSEL vector is used by the PHDEL units 350A–350D to vary the delay in series with the timing reference signals EDELOUT(3:0). The EDELOUT signals are extracted from the VDEL units 40A–40D at a point that is before the output of the respective VDEL unit. This point is chosen such that when the EDELOUT signals are delayed by the PHDEL units and when the EDELOUT to PH1 and the INCLK to INPULSE delays are taken into account, signal PH1 can be synchronized with signal INCLK or MEMCLK.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

What is claimed is:

1. A digital clock waveform generator comprising:
   a variable delay circuit including an input line, an output line, a propagation path coupled between said input line and said output line, and a control line, wherein said variable delay circuit is configured such that a propagation delay of said propagation path between said input line and said output line is variably controllable in response to a control signal provided to said control line;
   a control unit coupled to the control line of said variable delay circuit and configured to iteratively adjust the propagation delay of said variable delay circuit such that a period of a timing signal provided to said input line of said variable delay circuit is coverged upon by the propagation delay of said variable delay circuit; and
   a signal synthesis circuit coupled to a node connected to the propagation path of said variable delay circuit, wherein said signal synthesis circuit is configured to generate a clock signal having a duty cycle and a period that are dependent upon signal transitions between a high logical state and a low logical state occurring at said node connected to the propagation path of said variable delay circuit.

2. The digital clock waveform generator as recited in claim 1 wherein said propagation path of said variable delay circuit is formed by a plurality of variable delay elements coupled in series with respect to each other.

3. The digital clock waveform generator as recited in claim 2 wherein said signal synthesis circuit is coupled to a first node of a first of said plurality of variable delay elements and to a second node of a second of said plurality of variable delay elements, wherein the duty cycle and period of said clock signal are dependent upon signal transitions occurring at said first node and at said second node.

4. The digital clock waveform generator as recited in claim 1 further comprising a lock window circuit coupled to the output line of said variable delay circuit, wherein said lock window circuit includes a plurality of delay units, and wherein said control unit senses a first transition of said timing signal propagating through said lock window circuit at the same time a subsequent transition of said timing signal propagates through said variable delay circuit.

5. The digital clock waveform generator as recited in claim 4 further comprising a sampling latch circuit coupled to said lock window circuit and to said control unit for latching a plurality of signal levels present at a plurality of nodes within said lock window circuit.

6. The digital clock waveform generator as recited in claim 1 further comprising a phase generator circuit coupled to receive the clock signal generated by said signal synthesis circuit, wherein said phase generator circuit generates a pair of substantially non-overlapping internal microprocessor clock signals.

7. The digital clock waveform generator as recited in claim 1 further comprising a pulse generator circuit coupled to said input line of said variable delay circuit for generating said timing signal.

8. A digital clock waveform generator comprising:
   a delay chain including a plurality of variable delay units coupled in series, wherein a propagation delay associated with each of said variable delay units is dependent upon a control signal provided to each of said variable delay units;
   a lock window unit having a first delay element coupled to an output line of said delay chain and a second delay element coupled in series with the first delay element, wherein a first tap line is coupled at a first node located between said first and second delay elements;
   a control unit coupled to said delay chain and configured to generate the control signal provided to each of said variable delay units, wherein said control signal is dependent upon a signal level at said first tap line; and
   a clock synthesis circuit coupled to a plurality of nodes connected to said delay chain, wherein said clock synthesis circuit is configured to generate a clock signal in response to logical signal transitions that occur at each of said plurality of nodes connected to said delay chain.

9. The digital clock waveform generator as recited in claim 8 further comprising a sampling latch coupled to said first tap line of said lock window unit and to said control unit for latching the signal level at said first tap line.

10. The digital clock waveform generator as recited in claim 8 wherein said control unit generates the control signal such that a propagation delay of said delay chain substantially equals a period of a timing signal provided to said delay chain.

11. The digital clock waveform generator as recited in claim 8 wherein a second tap line is coupled at an output node of said second delay element, and wherein said control unit generates said control signal dependent upon the signal level at said first tap line and dependent upon a signal level at said second tap line.

12. A method for generating a clock signal comprising the steps of:
   providing a timing signal to an input line of a variable delay circuit;
   varying a propagation delay of a propagation path of said variable delay circuit such that a period of said timing signal is converged upon by the propagation delay of said variable delay circuit; and
   generating a clock signal having a duty cycle and a period that are dependent upon logical signal transitions that occur at a first node along the propagation path of said variable delay circuit.

13. The method for generating a clock signal as recited in claim 12 comprising the further step of monitoring whether a first logical transition of said timing signal has propagated through said variable delay circuit at a time at which a second logical transition of said timing signal occurs at an input line of said variable delay circuit.

14. The method for generating a clock signal as recited in claim 13 comprising the further step of providing said timing signal to a second propagation path after the timing signal is provided to said variable delay circuit.

15. The method for generating a clock signal as recited in claim 14 comprising the further step of latching a plurality of nodes along the second propagation path a predetermined time after the second logical transition of said timing signal occurs at the input line of said variable delay circuit.

16. A digital clock waveform generator comprising:

a delay chain including a plurality of variable delay units coupled in series, wherein a propagation delay of a propagation path formed by said delay chain is dependent upon a control signal, and wherein a timing signal is provided to an input line of said delay chain, and wherein each of said plurality of variable delay units includes at least one control line for receiving said control signal;

a control unit configured to generate the control signal and coupled to provide the control signal to each of said plurality of variable delay units of said delay chain, wherein said control unit is configured to generate the control signal dependent upon whether a first logical transition of said timing signal has propagated through said delay chain at a time at which a subsequent logical transition of said timing signal occurs at an input line of said delay chain; and a clock synthesis circuit coupled to at least a first node connected to said propagation path of said delay chain wherein said clock synthesis circuit is configured to generate a clock signal in response to logical signal transitions that occur at said first node connected to the propagation path of said delay chain.

17. The digital clock waveform generator as recited in claim 16 further comprising a lock window circuit including a plurality of delay elements, wherein said lock window circuit is coupled to an output line of said delay chain, and wherein said control means is coupled to a plurality of nodes that connect said plurality of delay units.

18. The digital clock waveform generator as recited in claim 16 further comprising a pulse generator unit coupled to said input line of said delay chain for generating said timing signal.

19. The digital clock waveform generator as recited in claim 16 wherein said control means is configured to cause the propagation delay of said delay chain to increase if the first logical transition of said timing signal has propagated through said delay chain when the subsequent logical transition of said timing signal occurs at the input line of said delay chain.

20. The digital clock waveform generator as recited in claim 19 further comprising a latch circuit coupled to an output line of said delay chain.

* * * * *